(12) United States Patent
Narushima et al.

(10) Patent No.: US 7,981,794 B2
(45) Date of Patent: Jul. 19, 2011

(54) FILM FORMING METHOD AND SUBSTRATE PROCESSING APPARATUS

(75) Inventors: Kensaku Narushima, Nirasaki (JP); Fumitaka Amano, Nirasaki (JP); Satoshi Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 133 days.

(21) Appl. No.: 12/445,813

(22) PCT Filed: Aug. 7, 2007

(86) PCT No.: PCT/JP2007/065433
§ 371 (c)(1),
(2), (4) Date: Apr. 16, 2009

(87) PCT Pub. No.: WO2008/053625
PCT Pub. Date: May 8, 2008

(65) Prior Publication Data
US 2010/0304561 A1    Dec. 2, 2010

(30) Foreign Application Priority Data
Oct. 30, 2006   (JP) .................................. 2006-293938

(51) Int. Cl.
*H01L 21/285* (2006.01)
(52) U.S. Cl. ................... 438/653; 118/704; 257/E21.17
(58) Field of Classification Search .................. 438/653, 438/656, 680, 683; 118/704; 257/E21.17
See application file for complete search history.

(56) References Cited

U.S. PATENT DOCUMENTS

| | | | |
|---|---|---|---|
| 5,747,384 A | 5/1998 | Miyamoto | |
| 6,143,377 A * | 11/2000 | Miyamoto | 427/576 |
| 6,524,952 B1 * | 2/2003 | Srinivas et al. | 438/649 |
| 7,244,668 B2 * | 7/2007 | Kim | 438/503 |
| 2006/0127601 A1 * | 6/2006 | Murakami et al. | 427/569 |

FOREIGN PATENT DOCUMENTS

| | | |
|---|---|---|
| JP | 4 196418 | 7/1992 |
| JP | 5 136087 | 6/1993 |
| JP | 8 176823 | 7/1996 |
| WO | WO 2005015622 A1 * | 2/2005 |

* cited by examiner

*Primary Examiner* — Matthew Smith
*Assistant Examiner* — Christine Enad
(74) *Attorney, Agent, or Firm* — Oblon, Spivak, McClelland, Maier & Neustadt, L.L.P.

(57) ABSTRACT

A barrier layer including a titanium film is formed at a low temperature, and a TiSi$_x$ film is self-conformably formed at the interface between the titanium film and the base. In forming the TiSi$_x$ film 507, the following steps are repeated without introducing argon gas: a first step of introducing a titanium compound gas into the processing chamber to adsorb the titanium compound gas onto the silicon surface of a silicon substrate 502; a second step of stopping introduction of the titanium compound gas into the processing chamber and removing the titanium compound gas remaining in the processing chamber; and a third step of generating plasma in the processing chamber while introducing hydrogen gas into the processing chamber to reduce the titanium compound gas adsorbed on the silicon surface and react it with the silicon in the silicon surface to form the TiSi$_x$ film 507.

16 Claims, 14 Drawing Sheets

FIG.12

| KIND OF FILM FORMING PROCESS | PLASMA ALD-Ti | PLASMA SFD-Ti |
|---|---|---|
| THICKNESS OF Ti FILM ON $SiO_2$ FILM(nm) | 7.4 | 9.5 |
| THICKNESS OF Ti FILM ON Si FILM(nm) | 23.1 | 8.7 |
| RATIO OF THICKNESS OF Ti FILM | 3.12 | 0.92 |

FIG.13

| COMPONENT | atom% |
|---|---|
| Si | 81.38 |
| Ti | 13.19 |
| Cl | 0.18 |
| O | 5.25 |

FIG.15

| | Ar EXISTS | Ar DOES NOT EXIST |
|---|---|---|
| RESISTANCE DISTRIBUTION | | |
| IN-PLANE UNIFORMITY(%) | 90.4 | 2.1 |
| SURFACE RESISTANCE (Ω/sq.) | 1306 | 270 |
| RESISTIVITY (μΩ·cm) | 1208 | 209 |

FILM FORMING METHOD AND SUBSTRATE PROCESSING APPARATUS

FIELD OF THE INVENTION

The present invention relates to a film forming method and substrate processing apparatus for forming a predetermined film on a target substrate such as a semiconductor wafer or a flat panel display (FPD) substrate.

BACKGROUND OF THE INVENTION

A semiconductor device, such as a CMOS transistor, has a connection structure including a wiring layer and a substrate, or a wiring layer and another wiring layer. In detail, as shown in FIG. 17, a contact hole 20 is formed between the P/N impurity diffusion layer (diffusion layer) 10 of a Si substrate (Si wafer) and a first wire, and a via hole 30 is formed between the first wire and a second wire. The contact hole 20 and via hole 30 are filled with metal such as tungsten or copper, and are electrically connected to the Si substrate or a wiring layer. Recently, prior to the filling of metal, barrier layers, such as Ti/TiN laminate layers, are formed in the contact hole 20 and the via hole 30, and thus barrier layers 22 and 32 are formed.

Conventionally, for the formation of a Ti layer or a TiN layer, physical vapor deposition (PVD) was used. However, at the present time, when the refinement and high-integration of semiconductor devices are conducted, the aspect ratio (ratio of diameter to depth) of a contact hole or a via hole has greatly increased. Due thereto, chemical vapor deposition (CVD) having good step coverage has been frequently employed in the formation of a barrier layer.

However, in order to reduce the contact resistance of metal in the diffusion layer 10 and the contact hole 20, it is preferable to interpose, for example, an alloy layer 12, such as a $TiSi_x$ film (titanium silicide film), between the barrier layer 22 and the diffusion layer 10, and to adjust the work functions of the interfaces between the barrier layer 22 and the diffusion layer 10, thus decreasing a Schottky barrier based on the difference between the work functions.

For example, plasma CVD may be used to form such a $TiSi_x$ film. This technique is configured to use $H_2$ gas as reducing gas while using $TiCl_4$ gas as a raw gas, and to form a Ti film at a temperature of about 650° C. and form the alloy layer 12 in a self-aligning manner by reacting part of the Ti film with the Si substrate simultaneously with the formation of the Ti film.

In addition, a method of forming a film by dividing a Ti film having a predetermined thickness through a plurality of processes has been proposed. For example, the following Patent Document 1 discloses plasma sequential flow deposition (SFD) as such a division film forming method. According to this processing method, a Ti film is prevented from being peeling and coming off even if the film is formed at a low temperature of, for example, 450° C. or less, and, as a result, a Ti film having good film quality can be formed.

Patent Document 1: Japanese Patent Application Publication No. 2004-232080

However, a request for a decrease in the temperature of film formation has recently increased mainly for the purpose of the realization of high-speed in semiconductor devices. Due thereto, a target substrate is preferably maintained at a low temperature (for example, 450° C. or less) even in the case of the formation of the barrier layer of a contact hole. However, when a Ti film is formed at low temperature using conventional plasma CVD, there is a problem in that a large amount of Cl remains in the Ti film, thus increasing the resistance of the Ti film.

Accordingly, a high-quality Ti film in which an excessively small amount of Cl remains even at low temperature can be formed in accordance with the formation of a Ti film based on plasma SFD. However, a Ti film formed by executing the plasma SFD at a high temperature of, for example, 650° C. or more reacts with a Si substrate, thus being easily silicided; and, as a result, a good $TiSi_x$ film can be formed. However, since a Ti film formed by executing plasma SFD at a low temperature of, for example, 450° C. or less cannot be easily silicided, it is difficult to form a good $TiSi_x$ film.

SUMMARY OF THE INVENTION

In view of the above, the present invention is to provide a film forming method which can efficiently form a barrier layer including a high-quality Ti film even at low temperature, and can form a TiSix film on an interface region between the Ti film and its base in a self-aligning manner.

To achieve the object, in accordance with one aspect of the present invention, there is provided a film forming method of forming a titanium film or a titanium compound film on a target substrate in a processing chamber, including a titanium silicide film formation step of forming a titanium silicide film on the target substrate; and a titanium film formation step of forming a titanium film on the titanium silicide film, wherein the titanium silicide film formation step is performed by repeating: a first step of introducing titanium compound gas into the processing chamber and adsorbing the titanium compound gas onto a surface of the target substrate, a second step of stopping the introduction of the titanium compound gas into the processing chamber to thereby remove the titanium compound gas remaining in the processing chamber, and a third step of generating plasma in the processing chamber while introducing hydrogen gas into the processing chamber to thereby reduce the titanium compound gas adsorbed onto a silicon-containing surface of the target substrate, and of reacting the titanium compound gas with silicon of the silicon-containing surface to thereby form the titanium silicide film, wherein the titanium film formation step is performed by repeating: a fourth step of generating plasma in the processing chamber while introducing the titanium compound gas and the hydrogen gas into the processing chamber to thereby form the titanium film on the target substrate, and a fifth step of stopping introduction of the titanium compound gas into the processing chamber while maintaining the plasma to thereby perform plasma annealing on the titanium film.

Further, there is provided a substrate processing apparatus, including: a processing chamber in which a film formation is formed on a target substrate; a gas supply unit configured to selectively supply at least titanium compound gas, reducing gas and argon gas into the processing chamber; a plasma generation unit configured to generate plasma in the processing chamber; a temperature adjustment unit configured to adjust a temperature of the target substrate mounted in the processing chamber; and a control unit configured to control operations of the gas supply unit, the plasma generation unit, and the temperature adjustment unit, wherein the control unit performs a titanium silicide film formation step of forming a titanium silicide film on the target substrate by repeating: a first step of introducing titanium compound gas into the processing chamber and adsorbing the titanium compound gas onto a surface of the target substrate, a second step of stopping introduction of the titanium compound gas into the processing chamber to thereby remove the titanium compound gas remaining in the processing chamber, and a third step of generating plasma in the processing chamber while introducing hydrogen gas into the processing chamber to thereby reduce the titanium compound gas adsorbed onto a silicon-containing surface of the target substrate, and of reacting the titanium compound gas with silicon of the silicon-containing surface to thereby form the titanium silicide film, and wherein the control unit performs a titanium film formation step of forming a titanium film on the titanium silicide film by repeating: a fourth step of generating plasma in the processing chamber while introducing the titanium compound gas and the hydrogen gas into the processing chamber to thereby form the titanium film on the target substrate, and a fifth step of stopping introduction of the titanium compound gas into the processing chamber while maintaining the plasma, thus performing plasma annealing on the titanium film.

According to the present invention, the first to third steps for stacking a titanium silicide film on a silicon-containing surface of the target substrate are performed two or more times, and thus a titanium silicide film having a predetermined thickness can be formed. Further, since a titanium compound can be effectively reduced to titanium even at low temperature through a hydrogen-plasma reducing process in the third process, the density of impurities such as Cl mixed in the titanium silicide film can be greatly decreased.

Further, in the third step, it is preferable that argon gas is not introduced into the processing chamber. Thus, the collision of argon atoms with the surface of the titanium silicide film formed on the silicon-containing surface of the target substrate can be prevented. By way of this, the morphology of the surface of the titanium silicide film is maintained in a good state.

Further, after the titanium silicide film having a predetermined thickness has been formed by repeating the first to third steps, the titanium film formation step for repeating the fourth and fifth steps two or more times is performed. Thus, the titanium film can be formed on the titanium silicide film. This titanium film formation step is a processing method based on the plasma SFD. According to this processing, since a relatively high film forming rate can be obtained, a barrier layer including both a titanium silicide film and a titanium film can be formed in a short period of time. Further, according to the titanium film formation step, the titanium film having few impurities can be formed even at low temperature.

In the titanium silicide film formation step and the titanium film formation step, it is preferable that a temperature of the target substrate is adjusted to 450° C. or less. In this way, according to the present invention, the thermal budget of a semiconductor device can be reduced, and the degradation of electrical characteristics attributable to high-temperature processing can be prevented.

It is preferable that, in the first step, the hydrogen gas together with the titanium compound gas are introduced into the processing chamber, and in the second step, the hydrogen gas is continuously introduced into the processing chamber. By way of this, the hydrogen gas can be used as purge gas for removing the titanium compound gas from the processing chamber.

In the titanium film formation step, it is preferable that argon gas is introduced into the processing chamber during at least a period in which plasma is formed in the processing chamber. Thus, the decomposition of the titanium compound gas is accelerated, and the plasma can be stabilized, and thus the efficiency of film formation can be improved.

It is also possible that the film forming method further includes: a titanium nitride film formation step of forming a titanium nitride film on the titanium film, wherein the titanium nitride film formation step is performed by repeating: a sixth step of generating plasma in the processing chamber while introducing the titanium compound gas and the hydrogen gas into the processing chamber to thereby form a titanium film on the target substrate, a seventh step of stopping introduction of the titanium compound gas into the processing chamber to thereby remove the titanium compound gas remaining in the processing chamber, and an eighth step of generating plasma in the processing chamber while introducing a nitrogen compound gas into the processing chamber to thereby nitride the titanium film.

Further, in the substrate processing apparatus, it is preferable that the gas supply unit is configured to selectively supply nitrogen compound gas into the processing chamber, and the control unit performs a titanium nitride film formation step of forming a titanium nitride film on the titanium film by repeating: a sixth step of generating plasma in the processing chamber while introducing the titanium compound gas and the hydrogen gas into the processing chamber to thereby form a titanium film on the target substrate, a seventh step of stopping introduction of the titanium compound gas into the processing chamber to thereby remove the titanium compound gas remaining in the processing chamber, and an eighth step of generating plasma in the processing chamber while introducing a nitrogen compound gas into the processing chamber to thereby nitride the titanium film.

According to the present invention, the sixth to eighth steps for stacking titanium nitride on the titanium film are performed two or more times, and thus a titanium nitride film having a predetermined thickness can be formed. Further, in the titanium nitride film formation step, a titanium nitride film having few impurities, such as Cl, can be formed even at low temperature. Therefore, there is no need to increase a processing temperature.

In the titanium nitride film formation step, it is preferable that a temperature of the target substrate is adjusted to 450° C. or less. At this temperature, the thermal budget of a semiconductor device can be reduced, and the degradation of electrical characteristics attributable to high-temperature processing can be prevented.

In the titanium nitride film formation step, it is also possible that argon gas is introduced into the processing chamber during at least a period in which plasma is formed in the processing chamber. Thus, the plasma can be stabilized while the decomposition of the titanium compound gas is accelerated, and thus the efficiency of film formation can be improved. Further, since the decomposition of the nitrogen compound gas is also accelerated, the titanium film is effectively nitrided, and thus a titanium nitride film having high quality can be formed.

It is also possible that the titanium compound gas is TiCl4 gas, and the nitrogen compound gas is NH3 gas. Through the employment of these gases, the titanium silicide film, the titanium film and the titanium nitride film, each having high quality, can be efficiently formed even at low temperature.

Further, according to the present invention, the titanium silicide film formation step, the titanium film formation step, and the titanium nitride film formation step can be performed in a single processing chamber. That is, since there is no need to prepare a separate processing chamber for each process, the minimization of the substrate processing apparatus is possible. Further, since respective steps can be continuously performed in a single processing chamber, for example, position alignment processing for the target substrate in the processing chamber, or transfer processing between processing chambers may be omitted. As a result, the throughput can be improved. Further, since continuous processing is possible while the processing chamber is maintained in a vacuum state, film formation can always be performed in clean environments.

According to the present invention, a barrier layer including a high-quality Ti film can be efficiently formed even at low temperature, and a TiSi$_x$ film can be formed on the interface region between the Ti film and a substrate in a self-aligning manner.

BRIEF DESCRIPTION OF THE DRAWINGS

FIG. 12 is a diagram showing the difference between the thicknesses of Ti films obtained when a Ti film formation process based on plasma ALD and a Ti film formation process based on plasma SFD are performed on a sample wafer;

FIG. 13 is a diagram showing the results of the analysis of components of a Ti film formed on an Si film by performing the Ti film formation process based on plasma ALD on a sample wafer;

FIG. 15 is a diagram showing electrical characteristics of a Ti film formed on an SiO$_2$ film when a Ti film formation step based on plasma ALD is performed on a sample wafer;

DESCRIPTION OF REFERENCE CHARACTERS

Figure 1:
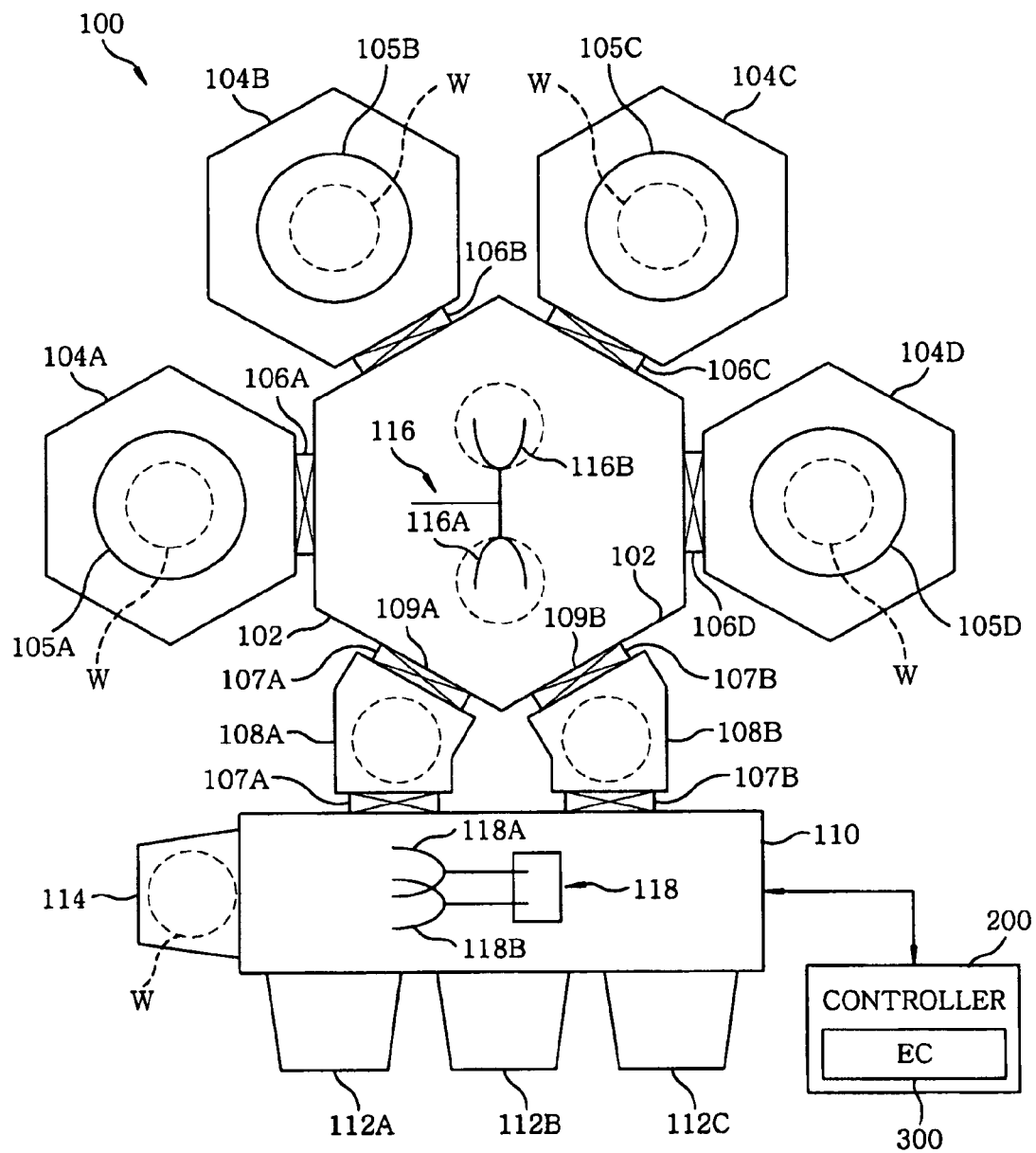
FIG. 1 is a sectional view showing an example of the configuration of a substrate processing apparatus according to an embodiment of the present invention.

100 substrate processing apparatus
102 common transfer chamber
104(104A~104D) processing chamber
105(105A~105D) mounting table
106A~106D gate valve
107A, 107B gate valve
108(108A, 108B) load-lock chamber
109(109A, 109B) transfer port
110 loading transfer chamber
112(112A~112C) introduction port
114 orienter
116 transfer mechanism
116A, 116B pick
118 loading transfer mechanism
118A, 118B pick
200 controller control unit
300 EC
310 CPU
320 RAM
330 display unit
340 input/output unit
350 notification unit
360 program data storage unit
362 transfer program
364 process program
370 process data storage unit
374 process data
400 plasma CVD processing chamber
411 processing chamber
412 susceptor
413 support member
414 guide ring
415 heater
416 lower electrode
1418 transfer port
419 insulating member
420 shower head
421 base member
422 shower plate
423 heater
424 gas injection opening
425 gas diffusion space
426 gas introduction port
430 gas supply unit
431 TiCl4 gas supply source
431C~434C mass flow controller
431L TiCl4 gas supply line
432 Ar gas supply source
432L Ar gas supply line
433 H$_2$ gas supply source
433L H$_2$ gas supply line
434 NH$_3$ gas supply source
434L NH$_3$ gas supply line
437 gas mixing unit
438 gaseous mixture supply line
440 heater power supply
441 heater power supply 442 matching unit
443 high frequency power supply
450 gas exhaust chamber
451 gas exhaust line
452 gas exhaust unit
460 wafer supporting pin
461 supporting plate
462 driving mechanism
500 silicon wafer
502 bare substrate
503 silicon surface
504 interlayer dielectric
505 contact hole
506 Ti film
506A first Ti film
506B second Ti film
507 TiSi$_x$ film
508 TiN film
G gate valve
W wafer

DETAILED DESCRIPTION OF THE PREFERRED EMBODIMENTS

Hereinafter, embodiments of the present invention will be described in detail with reference to the attached drawings. The same reference numerals are used throughout the different drawings to designate the same or similar components, and thus a repeated description thereof is omitted.

(Example of Construction of Substrate Processing Apparatus)

An example of the construction of a substrate processing apparatus according to an embodiment of the present invention is described below with reference to the drawings. FIG. 1 is a diagram schematically showing an example of the substrate processing apparatus according to the present embodiment. As shown in FIG. 1, the substrate processing apparatus 100 includes a common transfer chamber 102 formed in an approximately polygonal shape (for example, a hexagonal shape), a plurality of (for example, 4) processing chambers 104A to 104D configured to form a vacuum, two load-lock chambers 108A and 108B configured to form a vacuum, a loading transfer chamber 110 having an approximately rectangular shape, a plurality of (for example, 3) introduction ports 112A to 112C in which a cassette capable of accommodating a plurality of wafers W is mounted, and an orienter 114 configured to rotate each wafer W and optically obtain the eccentricity thereof, thus performing a position alignment.

The processing chambers 104A to 104D are connected to the circumference of the common transfer chamber 102 through gate valves 106A to 106D, respectively. The processing chambers 104A to 104D are provided with mounting tables 105A to 105D, respectively, which are each configured to allow a target substrate, for example, a semiconductor wafer (hereinafter referred to as a ⌈wafer⌋) to be mounted thereon. Each of the processing chambers 104A to 104D is implemented to perform a predetermined process on the wafer W mounted on a corresponding one of the mounting tables 105A to 105D.

The common transfer chamber 102 includes a transfer mechanism 116 provided with two picks 116A and 116B for holding a wafer W and configured to be bendable and rotatable. The common transfer chamber 102 is connected to the loading transfer chamber 110 through the two load-lock chambers 108A and 108B. The load-lock chamber 108A is connected both to the common transfer chamber 102 and to the loading transfer chamber 110 through gate valves 107A.

The load-lock chamber 108B is connected both to the common transfer chamber 102 and to the loading transfer chamber 110 through gate valves 107B.

Further, a transfer port 109A at a connection part between the common transfer chamber 102 and one of the two load-lock chambers, for example, the load-lock chamber 108A, is used as an entry hole through which a wafer W is exclusively carried into the common transfer chamber 102. A transfer port 109B at a connection part between the common transfer chamber 102 and the other load-lock chamber 108B is used as an exit hole through which a wafer W is exclusively carried from the common transfer chamber 102.

The loading transfer chamber 110 is connected to, for example, three introduction ports 112A to 112C and the orienter 114. Further, the loading transfer chamber 110 includes a loading transfer mechanism 118 provided with two picks 118A and 118B for holding a wafer W and configured to be bendable, rotatable, liftable and linearly movable.

Further, the substrate processing apparatus 100 is connected to the control unit 200 and is configured such that respective components of the substrate processing apparatus 100 are controlled by the control unit 200.

(Example of Construction of Control Unit)

Figure 2:
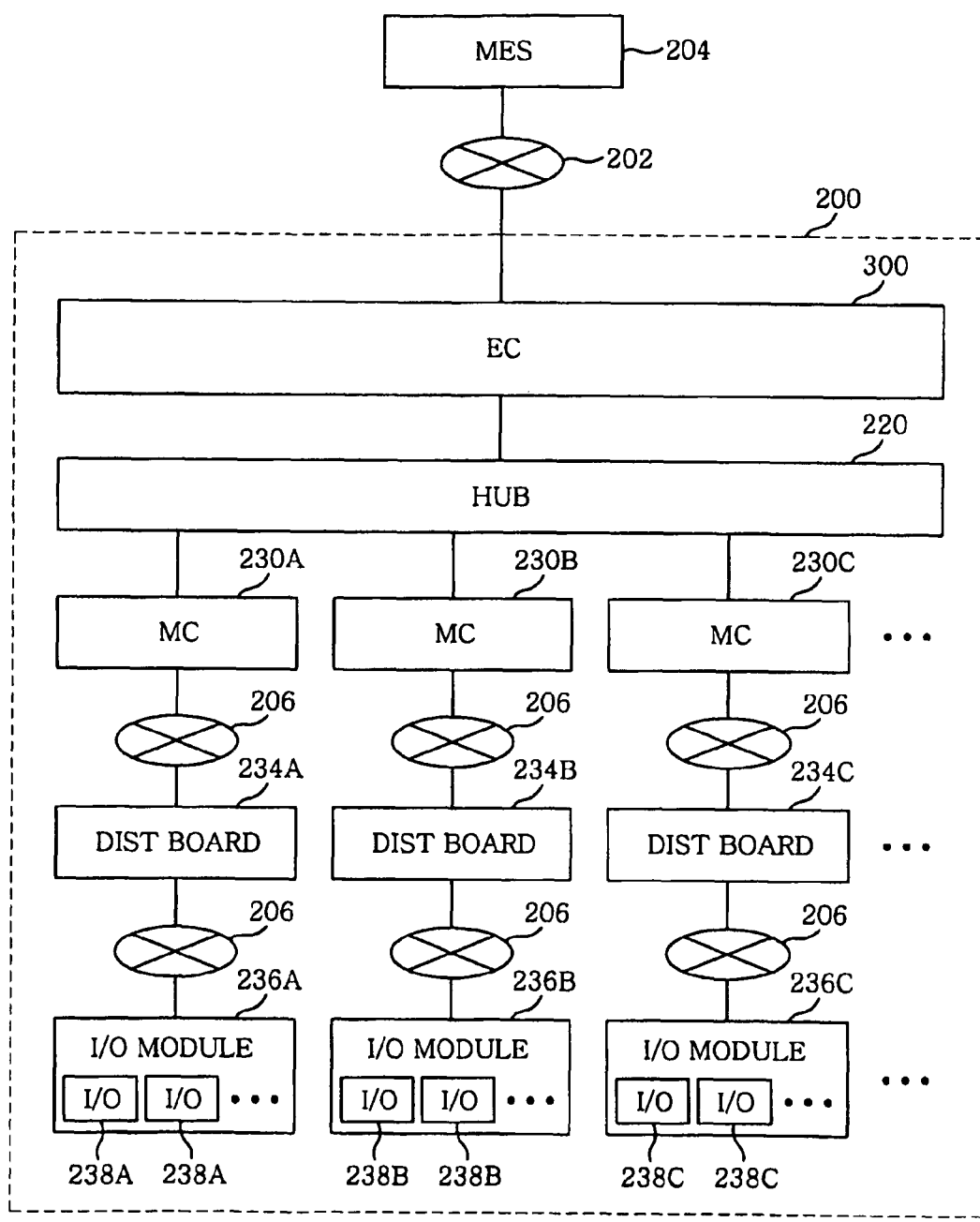
FIG. 2 is a block diagram showing an example of the construction of the control unit (system controller) of FIG. 1.

An example of the construction of the control unit 200 of the substrate processing apparatus 100 is described with reference with the attached drawings. FIG. 2 is a block diagram showing the construction of the control unit (system controller) 200. As shown in FIG. 2, the control unit 200 includes a device control unit (EC: Equipment Controller) 300, a plurality of module control units (Module Controllers: MCs) 230A, 230B, 230C, . . . , and a switching hub 220 for connecting the EC 300 to the respective MCs 230A, 230B, 230C, . . . .

The control unit 200 is connected from the EC 300 to a Manufacturing Execution System (MES) 204 for managing the entire manufacturing process of a company, in which the substrate processing apparatus 100 is installed, over, for example, a Local Area Network (LAN) 202. The MES 204 is implemented using, for example, a computer. The MES 204 performs a determination about a manufacturing process in consideration of the entire load of the company while feeding back real-time data about the manufacturing process of the company to a basic working system (not shown) in conjunction with the control unit 200.

The EC 300 unifies the MCs 230A, 230B, 230C, . . . , and configures a main control unit (master control unit) for controlling the entire operation of the substrate processing apparatus 100. The switching hub 220 switches the connection location of the EC to the MCs 230A, 230B, 230C, . . . in response to a control signal from the EC 300.

The respective MCs 230A, 230B, 230C, . . . constitute a sub-control unit (slave control unit) for controlling the operations of respective modules, such as the common transfer chamber 102, the processing chambers 104A to 104D, the load-lock chambers 108A and 108B, the transfer chamber 110 and the orienter 114 of the substrate processing apparatus 100. The respective MCs 230A, 230B, 230C, . . . are connected to I/O (input/output) modules 236A, 236B, 236C, . . . via, for example, GHOST networks 206, by way of respective Distribution (DIST) boards 234A, 234B, 234C, . . . . Each of the GHOST networks 206 is a network implemented by a Large-Scale Integration (LSI) called a General High-Speed Optimum Scalable Transceiver (GHOST) mounted on the MC board of the EC 300. The GHOST network 206 can be connected to a maximum of 31 I/O modules. Further, in the GHOST network 206, the MCs are masters, and the I/O modules are slaves.

Each of the I/O modules 236A, 236B, 236C, ... includes a plurality of I/O units 238A, 238B, 238C, ... which are connected to respective components of the modules (hereinafter referred to as ⌈end devices⌉), such as the processing chambers 104A to 104D, and performs the transmission of control signals to the end devices and of signals output from the end devices. For example, the end devices of the processing chamber 104 may be a mass flow controller for controlling the flow rate of gas introduced into the processing chamber 104, an Automatic Pressure Control (APC) valve for controlling the exhaust of air from the processing chamber 104, etc.

Each GHOST network 206 is also connected to an I/O board (not shown) for controlling the input/output of digital signals, analog signals, and serial signals to/from the I/O units 238A, 238B, 238C, ....

Figure 3:
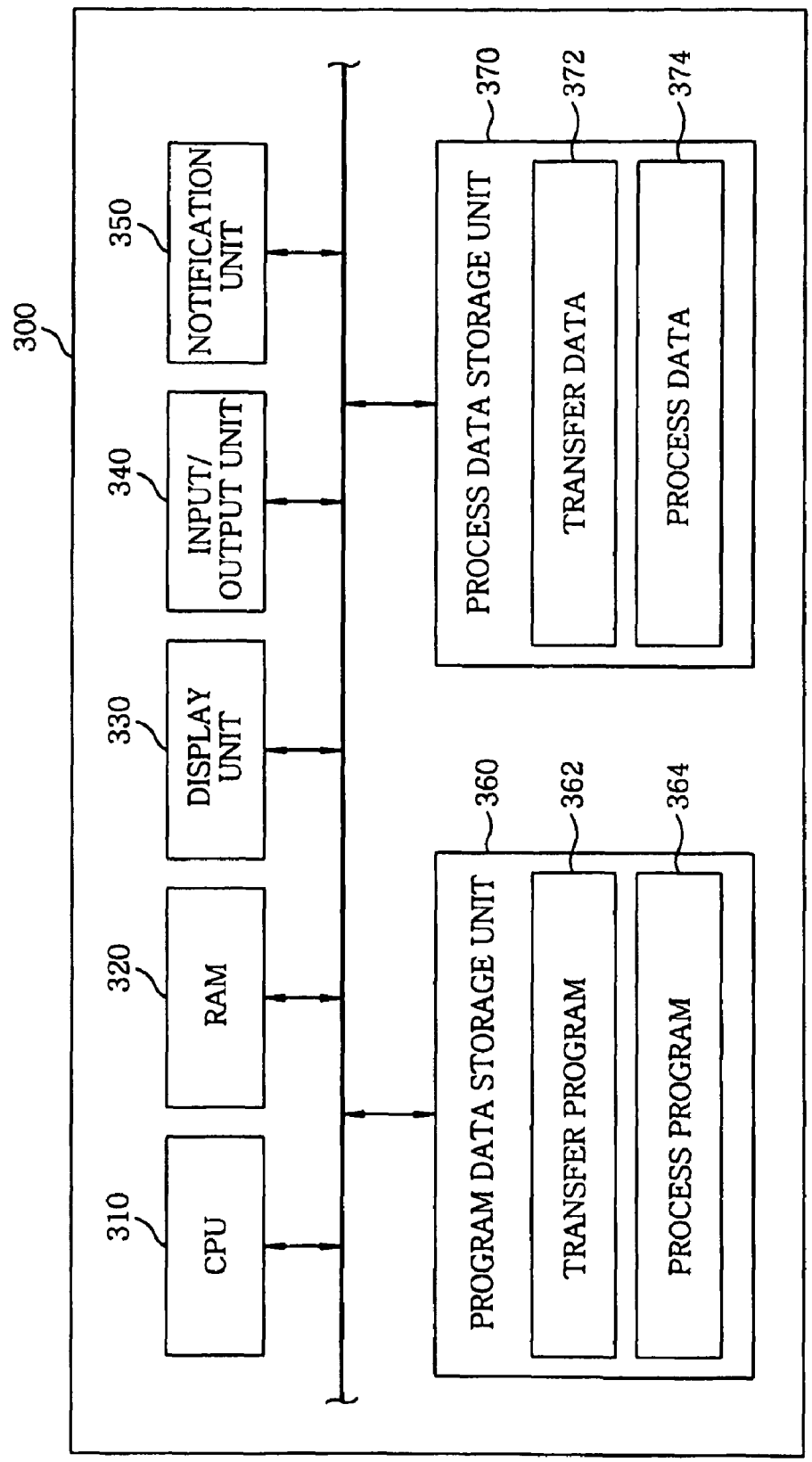
FIG. 3 is a block diagram showing an example of the construction of an Equipment controller (device control unit) in an embodiment of the present invention.

Here, an example of the construction of the EC 300 shown in FIG. 2 is described below with reference to the drawings. FIG. 3 is a block diagram showing an example of the construction of the EC 300. As shown in FIG. 3, the EC 300 includes a Central Processing Unit (CPU) 310 constituting the main body of the EC, Random Access Memory (RAM) 320 provided with a memory area used to process various types of data executed by the CPU 310, a display unit 330 implemented using a Liquid Crystal Display (LCD) for displaying a manipulation screen or selection screen, an input/output unit 340 configured to perform the input operation of various types of data, such as the inputting or editing of a process recipe by an operator, and the output operation of various types of data, such as the outputting of a process recipe, a process, and log to a predetermined storage medium, and a notification unit 350, such as an alarm (for example, a buzzer) configured to provide a warning when an abnormality such as an electric leakage occurs in the substrate processing apparatus 100.

Further, the EC 300 includes a program data storage unit 360 for storing process programs required for the performance of various processes by the substrate processing apparatus 100, and a process data storage unit 370 for storing information (data) required for the execution of the process programs. The program data storage unit 360 and the process data storage unit 370 are constructed in a storage area, for example, a Hard Disc Drive (HDD). The CPU 310 executes various process programs by reading required programs and data from the program data storage unit 360 and the process data storage unit 370 as needed.

The CPU 310, the RAM 320, the display unit 330, the input/output unit 340, the notification unit 350, the program data storage unit 360, and the process data storage unit 370 are connected to each other through bus lines, such as a control bus and a data bus. The bus lines are also connected to the switching hub 220.

In this case, an example of the control of the substrate processing apparatus 100 using the control unit 200 having the above-described construction is described below. In each of the processing chambers 104A to 104D, when various processes, for example, a Chemical Oxide Removal (COR) process, a Post Heat Treatment (PHT) process, a Ti film formation step, and a TiN film formation step are performed on a Si wafer W, the CPU 310 of the EC 300 reads a process program to be executed from the process program 364 of the program data storage unit 360, reads the recipe data of a process to be performed from the process data 374 of the process data storage unit 370, and performs respective steps on the basis of the process program and the process recipe data. Further, the COR process and the PHT process are kinds of impurity removal processes. Detailed procedures of each process will be described later.

The CPU 310 performs each process by transmitting control signals to desired end devices via the MCs 230 for controlling the switching hub 220 and the processing chambers 104A to 104D, the GHOST networks 206, and the I/O units 238 of the I/O modules 236, according to each process program.

In the control unit (system controller) 200 of FIG. 2, the I/O units connected to a plurality of end devices are implemented as modules, without the plurality of end devices being directly connected to the EC 300, thus constituting the I/O modules. Since such an I/O module is connected to the EC 300 via the MC and the switching hub 220, the communication system can be simplified.

Further, since control signals transmitted from the CPU 310 of the EC 300 include the address of an I/O unit connected to a desired end device, and the address of the I/O module including the I/O unit, the switching hub 220 refers to the address of the I/O module included in the control signal, and the GHOST of the MC refers to the address of the I/O unit included in the control signal, so that the switching hub 220 or the MC does not need to inquire of the CPU 310 about the destination of the control signals, thus realizing the smooth transmission of the control signals.

(Example of Construction of Processing Chambers)

Next, an example of the construction of the processing chambers in the substrate processing apparatus 100 of FIG. 1 is described below. The substrate processing apparatus 100 can be configured to successively perform an impurity removal process for removing impurities, such as a native oxide film, on a Si wafer without using plasma in a decompression state, a Ti film formation step for forming a Ti film on the Si surface of the Si wafer on which the impurity removal process has been performed, and a TiN film formation step for forming a TiN film on the Ti film.

In this embodiment, for example, one of the processing chambers 104A to 104D is implemented as an impurity removal processing chamber for performing the impurity removal process, and another one thereof is implemented as a Ti film and TiN film formation processing chamber for performing the Ti film formation step (including the self-aligned silicidation of the Ti film) and the TiN film formation step. Further, when the impurity removal process is divided into two steps, that is, a product generation process (for example, COR process) and a product removal process (for example, PHT process), and the steps are separately performed, any two of the processing chambers 104A to 104D are implemented as a product generation processing chamber and a product removal processing chamber, respectively. Further, it is also preferable that the Ti film formation step and the TiN film formation step be performed in different processing chambers. In this way, in the substrate processing apparatus 100, the construction of respective processing chambers 104A to 104D is designated depending on the details of processes to be performed.

Figure 4:
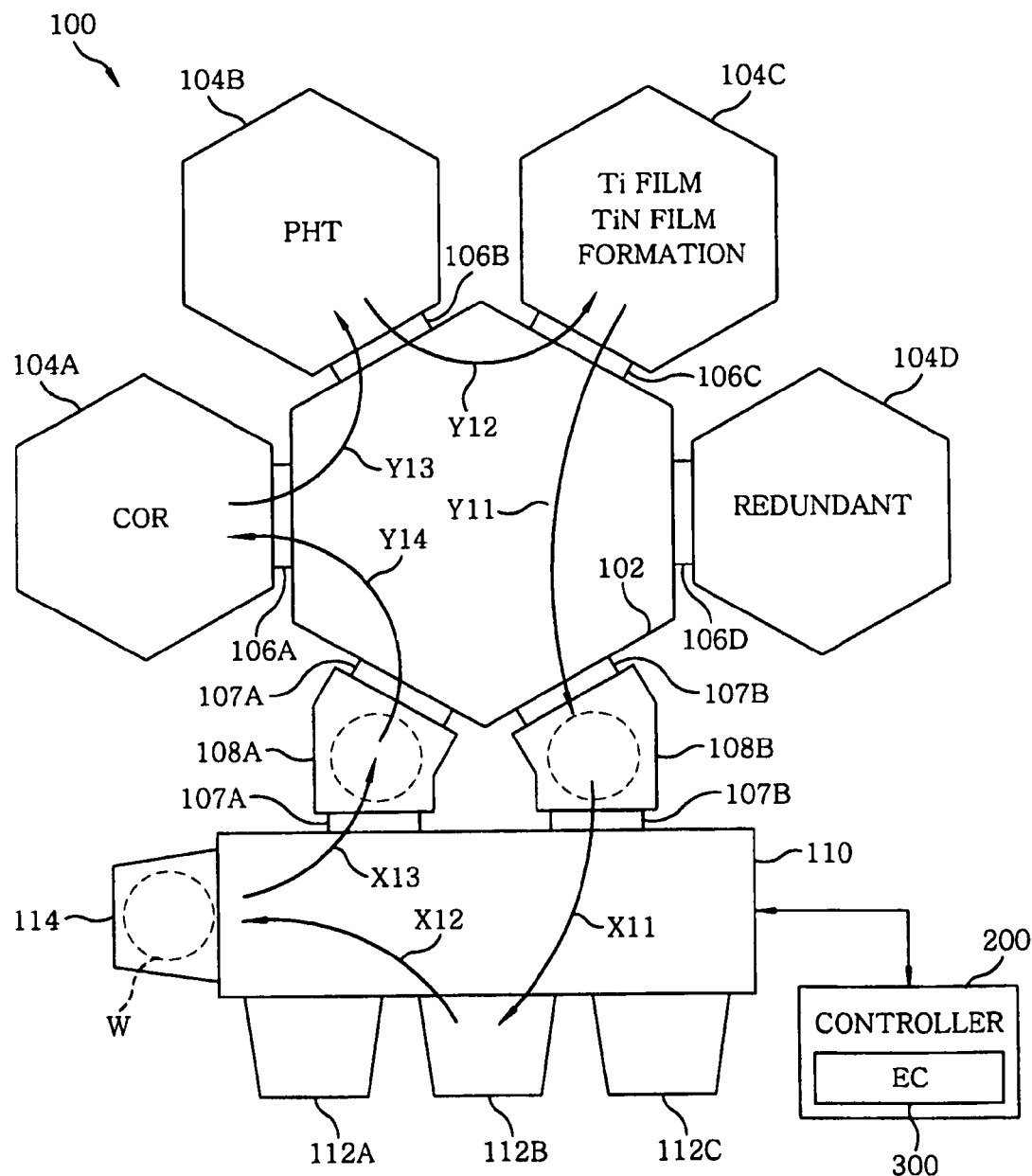
FIG. 4 is a diagram showing an example of the construction of a processing chamber in the substrate processing apparatus of FIG. 1.

For example, in the case where, for example, a Si wafer W having a contact hole formed therein is introduced into the substrate processing apparatus 100, a COR process and a PHT process, as the above-described impurity removal process, are successively performed on the Si wafer W, and thereafter a Ti film formation step and a TiN film formation step are successively performed, an example of the construction of the processing chambers in the substrate processing apparatus 100 is shown in FIG. 4.

As shown in FIG. 4, in the substrate processing apparatus 100 according to the present embodiment, processing chambers 104A, 104B and 104C are implemented as a COR processing chamber, a PHT processing chamber, and a Ti film and TiN film formation processing chamber, respectively. The process in each of the processing chambers 104A to 104C is performed on the basis of the process program 364 stored in the program data storage unit 360 that is provided in the EC 300 of the control unit 200. That is, the CPU 310 of the EC 300 performs each process by reading a required process program from the process program 364, and reading required information from the process data (for example, process recipe data) 374 stored in the process data storage unit 370.

(Example of Construction of Ti Film Formation Processing Chamber)

Figure 5:
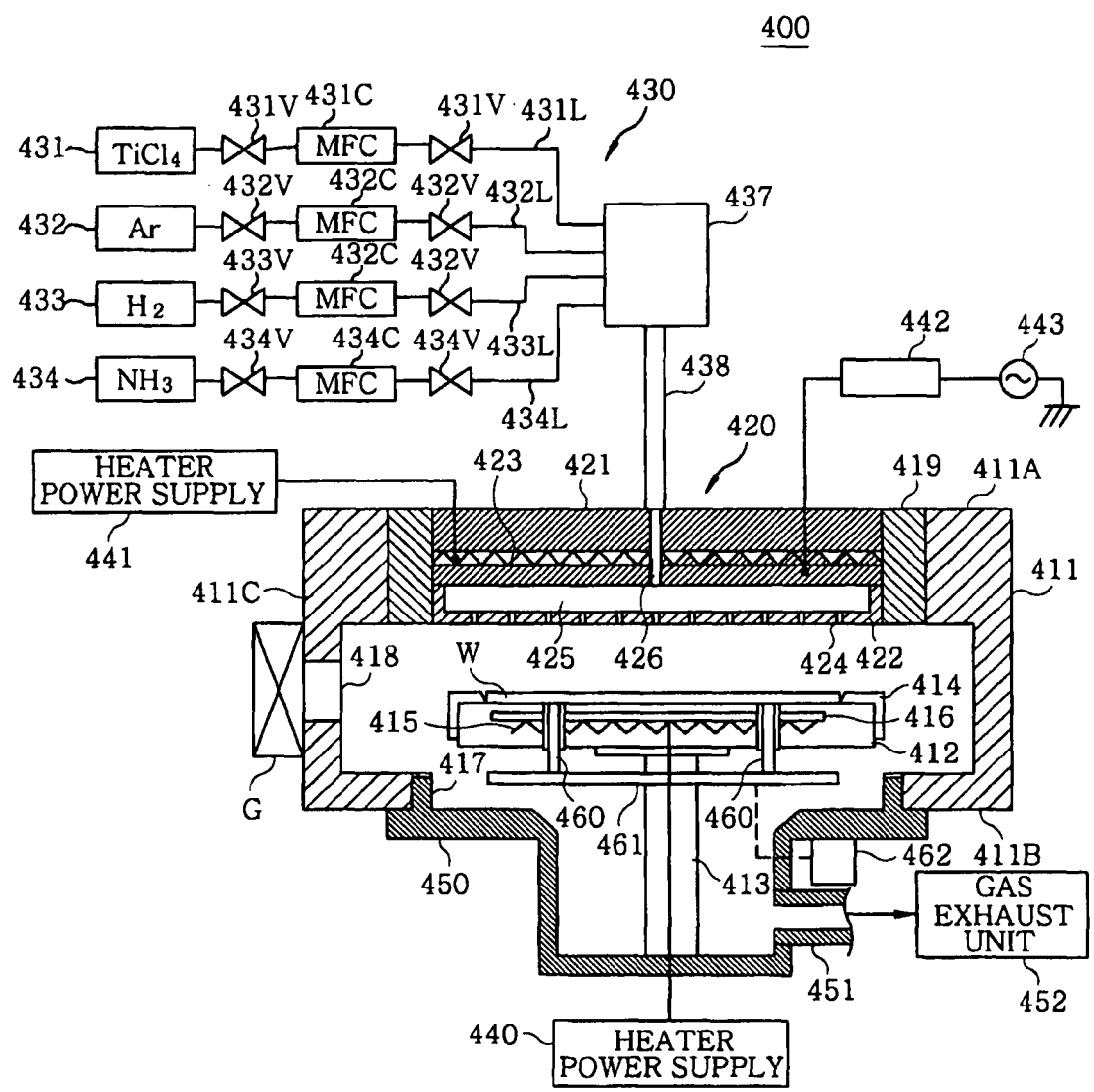
FIG. 5 is a sectional view showing an example of the construction of a Ti film and TiN film formation processing chamber according to an embodiment of the present invention.

Next, in this embodiment, an example of the construction of a Ti film and TiN film formation processing chamber which is a main processing chamber is described below with reference to the drawings. The Ti film formation processing chamber is implemented using, for example, the plasma CVD processing chamber 400 of FIG. 5 for forming a Ti film through plasma CVD. This plasma CVD processing chamber 400 includes an airtight processing chamber 411 having an approximately cylindrical shape.

In the processing chamber 411, a susceptor 412 for horizontally supporting a wafer W is disposed while being supported by a cylindrical support member 413 provided in the lower portion of the center of the chamber. This susceptor 412 is made of ceramic, such as AlN, and a guide ring 414 for guiding the wafer W is provided on the outer circumference of the susceptor.

Further, in the susceptor 412, a heater 415 is embedded and is configured to heat the wafer W at a predetermined temperature by being fed with power from a heater power supply 440. That is, the heater 415 and the heater power supply 440 constitute a temperature control unit. In the susceptor 412, a lower electrode 416 is embedded on the heater 415, and is, for example, grounded.

A shower head 420 is provided on the ceiling wall 411A of the processing chamber 411 via an insulating member 419. Such a shower head 420 is mainly divided into a base member 421, which is an upper portion, and a shower plate 422, which is a lower portion.

In the base member 421, a heater 423 is embedded, and is configured to heat the shower head 420 at a predetermined temperature by being fed with power from a heater power supply 441.

In the shower plate 422, a plurality of gas injection openings 424 for exhausting gas into the processing chamber 411 is formed. Each gas injection opening 424 communicates with a gas diffusion space 425 formed between the base member 421 and the shower plate 422. The center portion of the base member 421 is provided with a gas introduction port 426 for supplying a process gas to the gas diffusion space 425. The gas introduction port 426 is connected to the gaseous mixture supply line 438 of a gas supply unit 430, which will be described later.

The gas supply unit 430 includes a $TiCl_4$ gas supply source 431 for supplying a $TiCl_4$ gas, which is a Ti compound gas, an Ar gas supply source 432 for supplying Ar gas, a $H_2$ gas supply source 433 for supplying $H_2$ gas, which is reducing gas, and a $NH_3$ gas supply source 434 for supplying $NH_3$ gas, which is a nitrogen compound gas.

Further, the $TiCl_4$ gas supply source 431 is connected to a $TiCl_4$ gas supply line 431L, the Ar gas supply Fsource 432 is connected to an Ar gas supply line 432L, the $H_2$ gas supply source 433 is connected to a $H_2$ gas supply line 433L, and the $NH_3$ gas supply source 434 is connected to an $NH_3$ gas supply line 434L. In the respective gas lines 431L to 434L, two valves 431V to 434V are disposed with Mass Flow Controllers (MFCs) 431C to 434C interposed therebetween.

A gas mixing unit 437 has a function of mixing the process gases and supplying the gaseous mixture to the shower head 420, and the gas inflow side thereof is connected to the process gas supply sources 431 to 434 via the respective gas supply lines 431L to 434L, and the gas outflow side thereof is connected to the shower head 420 via the gaseous mixture supply line 438.

During a process, one type of gas selected from among the $TiCl_4$ gas, the Ar gas, the $H_2$ gas, and the $NH_3$ gas, or a gaseous mixture of the plurality of gases, is introduced from the plurality of gas injection openings 424 into the processing chamber 411 via the gas introduction port 426 and the gas diffusion space 425 of the shower head 420.

The shower head 420 according to the present embodiment is implemented in a so-called premix type in which process gases are mixed in advance and a gaseous mixture is supplied into the processing chamber 411, but may be implemented in a post-mix type in which respective process gases are independently supplied into the processing chamber 411.

The shower head 420 is connected to a high-frequency power supply 443 via a matching unit 442, and a high-frequency electric field is generated between the shower head 420 and the lower electrode 416 by supplying a high-frequency power of, for example, 450 kHz from the high-frequency power supply 443 to the shower head 420 at the time of forming films. The process gases supplied into the processing chamber 411 are converted into plasma, and a Ti film or a TiN film is formed. That is, the shower head 420, the matching unit 442, the high-frequency power supply 443 and the lower electrode 416 constitute a plasma generation unit.

A circular hole 417 is formed in the center portion of the bottom wall 411B of the processing chamber 411, and a gas exhaust chamber 450 protruding downwards to cover the hole 417 is formed on the bottom wall 411B. A exhaust line 451 is connected to the side surface of the gas exhaust chamber 450, and an gas exhaust unit 452 is coupled to the exhaust line 451. Further, the internal space of the processing chamber 411 may be decompressed to a predetermined vacuum level by operating such a gas exhaust unit 452.

In the susceptor 412, three wafer supporting pins 460 (only two pins are shown) for supporting and lifting a Si wafer W are provided to be projected or retracted from the surface of the susceptor 412. These wafer supporting pins 460 are fixed to a supporting plate 461. Further, the wafer supporting pins 460 lift up or down via the supporting plate 461 using a driving mechanism 462, such as an air cylinder.

A transfer port 418 for enabling a Si wafer to be carried into or from the common transfer chamber 102 and a gate valve G for opening and shutting the transfer port 418 are formed in the side wall 411C of the processing chamber 411. Further, details of the formation of a Ti film and a TiN film performed in the processing chamber 411 having the above construction will be described later.

(Detailed Example of Wafer Transfer Process)

Here, the wafer transfer process of the substrate processing apparatus 100, constructed as shown in FIG. 4, is described below. In the common transfer chamber 102, a Si wafer W is sequentially transferred to the processing chambers 104A, 104B and 104C and is processed therein. Due thereto, the transfer path of the Si wafer W is represented by arrows indicated by solid lines in FIG. 4.

The wafer transfer process is performed on the basis of a transfer program 362 stored in the program data storage unit 360 provided in the EC (device control unit) 300 of the control unit 200. That is, the CPU 310 of the EC 300 reads required data from transfer data (for example, transfer path data) 372 stored in the process data storage unit 370, and executes the transfer program 362, thus performing the transfer process on the Si wafer W.

In this case, as an example, a wafer W, in which a contact hole or a via hole is formed and is to be processed, is carried from a cassette (including a carrier) installed in the center introduction port 112B. Further, one of two load-lock chambers 108A and 108B, for example, the load-lock chamber 108A, is used to carry a wafer W to be processed thereinto, and the other load-lock chamber 108B is used to carry the processed wafer W therefrom. Currently, in respective processing chambers 104A to 104C, wafers W are accommodated and respective processes thereof have been, or almost are, terminated.

First, the transfer process performed in the loading transfer chamber 110 is described below. When it is assumed that a processed Si wafer W, the processing of which has been terminated in the processing chamber 104C, is accommodated in the load-lock chamber 108B, the processed Si wafer W is transferred to and accommodated in the center introduction port 112B, as indicated by a transfer path X11, by means of the loading transfer mechanism 118.

Further, a Si wafer W, which is to be processed and is accommodated in the center introduction port 112B, is transferred to the orienter 114, as indicated by a transfer path X12, by means of the loading transfer mechanism 118, and the position of the Si wafer W is aligned therein. Thereafter, the Si wafer W, the position alignment of which has been terminated, is accommodated in the other load-lock chamber 108A, as indicated by a transfer path X13, by means of the loading transfer mechanism 118, and then waits in the load-lock chamber 108A. The above operations are repeated whenever the process on a Si wafer W is performed.

Next, the wafer transfer process in the common transfer chamber 102 is described below. First, the transfer mechanism 116 is moved to take a processed wafer W, which is accommodated in the processing chamber 104C, out of the processing chamber 104C, and the wafer W is arranged in the empty load-lock chamber 108B, as indicated by a transfer path Y11. Next, the transfer mechanism 116 is moved to take a processed wafer W, which is accommodated in the processing chamber 104B, out of the processing chamber 104B, and the wafer W is carried into the empty processing chamber 104C, as indicated by a transfer path Y12. The processing in the processing chamber 104C is initiated.

Next, the transfer mechanism 116 is moved to take a processed wafer W, which is accommodated in the processing chamber 104A, out of the chamber 104A, and the wafer W is carried into the empty processing chamber 104B, as indicated by a transfer path Y13. The processing in the processing chamber 104B is initiated.

Next, the transfer mechanism 116 is moved to take a wafer W, which is waiting in the load-lock chamber 108A and is to be processed, out of the processing chamber 108A. The wafer W is carried into the empty processing chamber 104A, as indicated by a transfer path Y14, and the processing in the processing chamber 104A is initiated. Further, when the wafer W is carried into or from the processing chamber, a gate valve required to carry the wafer W into or from the processing chamber, among the gate valves 106A to 106C, 107A, and 107B, is operated to be opened or shut. Further, the above operations are repeated whenever processing of a wafer W is completed in each of the processing chambers 104A to 104C.

(Detailed Example of Wafer Processing)

Next, wafer processing performed by the substrate processing apparatus 100 according to the present embodiment is described below. The substrate processing apparatus 100 performs processing on a Si wafer (Si substrate) 500 having the film structure of FIG. 6. The Si wafer 500 is formed in such a way that an interlayer dielectric 504, such as a $SiO_2$ film, is formed on a bare substrate 502, a contact hole 505 is formed through etching, and a Si surface 503 is exposed to the bottom of the contact hole 505.

Figure 6:
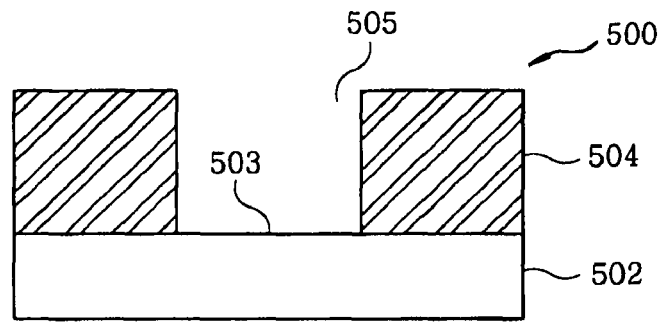
FIG. 6 is a diagram showing a detailed example of the film structure of a Si wafer in an embodiment of the present invention.

Here, the case where a $TiSi_x$ film (Ti silicide film) is formed on the Si surface 503 of FIG. 6 is described by way of example. FIGS. 7A to 7D are process diagrams showing wafer processing according to the present embodiment. The substrate processing apparatus 100 according to the present embodiment receives the Si wafer 500 of FIG. 6, and then performs the following processes continuously.

Figure 7A:
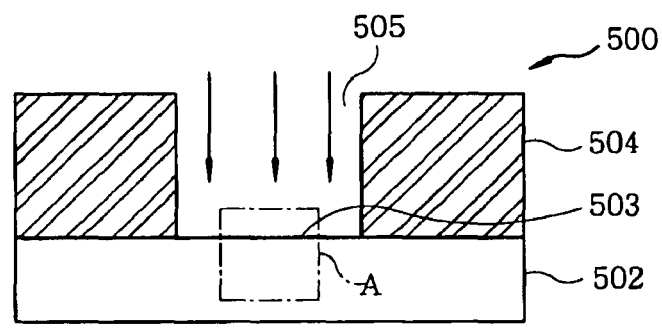
FIG. 7A is a diagram showing an impurity removal process according to an embodiment of the present invention.

First, as shown in FIG. 7A, an impurity removal process for removing impurities from the Si surface 503 (for example, contamination such as etching residues, particles, and a native oxide film) is performed. By means of this process, for example, the bottom of the contact hole (portion A in FIG. 7A) becomes a flat and even surface free of impurities such as a native oxide film. In the prior art, etching by Ar plasma sputtering was conducted as such an impurity removal process. In this technology, Ar ions ionized by plasma are accelerated using a bias voltage applied to the Si wafer and impurities including a native oxide film attached to the Si wafer are etched through sputtering etching. However, with the recent refinement of semiconductor devices, the size of a contact hole has been reduced, and thus it is difficult to remove impurities from the bottom of the contact hole by using only Ar plasma sputtering.

Therefore, in the present embodiment, the impurity removal process is performed without using plasma in a decompression state. This impurity removal process is implemented as a two-step process, including a product generation process for processing a product by chemically reacting impurities including, for example, a negative oxide film attached to the Si wafer with gas components; and a product removal process for removing the product generated on the Si wafer through heat treatment.

The product generation process is, for example, a COR process, and the product removal process is, for example, a PHT process. The COR process is a process of chemically reacting impurities attached to the Si wafer (for example, an oxide film such as a native oxide film) with gas molecules such as the molecules of ammonia ($NH_3$) gas or Hydrogen Fluoride (HF) gas, thus generating a product (mainly, $(NH_4)_2SiF_6$). The PHT process is a process of heating the Si wafer, on which the COR process has been performed, and evaporating the product generated on the Si wafer through the chemical reaction of the COR process, thus removing the product from the Si wafer.

In this way, a combination of the COR process and the PHT process can remove impurities such as a native oxide film on the Si wafer without using plasma in a decompression state. Thus, it is a pure chemical cleaning technology among dry cleaning processes.

As described above, in the present embodiment, the impurity removal process requiring no plasma in a decompression state is performed, and thus the close contact property and strength of a Ti film can be improved in the Ti film formation step that is subsequently performed. Further, since the impurity removal process according to the present embodiment does not use plasma, a charge-up damage attributable to plasma can be prevented from occurring on the base of the Ti film (especially the surface of the diffusion layer of the Si wafer), and the surface of the diffusion layer is prevented from getting rough or cut that might occur in case of sputtering etching. In this way, a contact structure can be formed without damage, and a film having a good contact resistance can be formed.

Next, while the Si wafer 500 is not exposed to air, the process for forming a Ti film 506 is successively performed in the substrate processing apparatus 100. The process for forming the Ti film 506 according to the present embodiment is divided into two steps: a step of forming a first Ti film 506A and a TiSi$_x$ film 507; and a step of forming a second Ti film 506B.

Figure 7B:
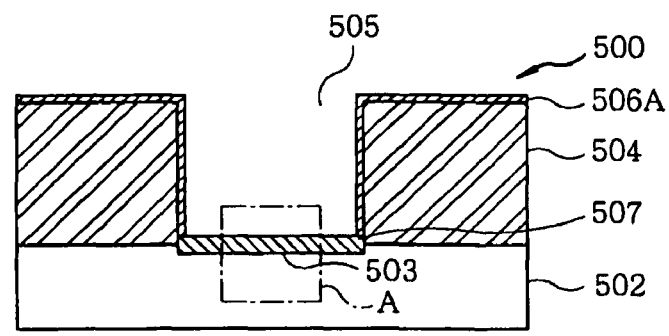
FIG. 7B is a diagram showing a first Ti film formation process according to an embodiment of the present invention.

In the step of forming the first Ti film 506A and the TiSi$_x$ film 507 shown in FIG. 7B, a Ti film formation is performed by plasma Atomic Layered Deposition (ALD) method. In this plasma ALD, an adsorption process and a reducing process are performed two or more times. In the adsorption process, a Ti compound gas, such as TiCl$_4$ gas, is supplied to the processing chamber to induce adsorption (reaction between Ti and Si) of a Ti compound onto the Si surface 503 and the surface of the interlayer dielectric 504. In the reducing process, a reducing gas, such as H$_2$ gas, is supplied while plasma-exciting to reduce a Ti compound that has been adsorbed onto the Si surface 503 and the surface of the interlayer dielectric 504. By means of this, Ti is deposited on the base, and thus the Ti film is formed. A detailed process recipe related to the formation of the Ti film based on plasma ALD according to the present embodiment will be described later.

Through this method, as shown in FIG. 7B, Ti is deposited on the Si surface 503 and the surface of the interlayer dielectric 504 at an atomic level. During this operation, the first Ti film 506A is formed on the surface of the interlayer dielectric 504. Meanwhile, on the surface of the Si surface 503, that is, the bottom of the contact hole (portion A in FIG. 7A), the deposited Ti is silicided by Si of the underlying Si surface 503, and thus the TiSi$_x$ film 507 is formed in a self-aligning manner.

By performing the plasma ALD, the film thickness of the first Ti film 506A and the TiSi$_x$ film 507 can be freely controlled at the atomic level. Further, by depositing Ti by repeating the adsorption process and the reducing process for the Ti compound two or more times, impurities, such as Cl contained in the Ti film, can be reduced more reliably. In particular, according to the present embodiment, since Ti is deposited while the atomic arrangement of Ti is constantly controlled through plasma ALD in the state in which impurities, such as a native oxide film, are not attached to the Si surface 503 of the Si wafer 500 by the impurity removal process using the COR and PHT processes, the first Ti film 506A and the TiSi$_x$ film 507 can be formed more flatly and evenly.

Further, in the present embodiment, when the first Ti film 506A and the TiSi$_x$ film 507 are formed, a process temperature (temperature of the Si wafer) is set to a relatively low temperature, for example, a temperature range of 450° C. or less. In this way, the thermal budget of a semiconductor device can be reduced by setting the process temperature to a relatively low temperature. Further, in the present embodiment, although the process temperature is adjusted to 450° C. or less in order to perform plasma ALD, the density of impurities, such as Cl contained in the first Ti film 506A and the TiSi$_x$ film 507, is decreased, thus enabling a high-quality film to be formed.

Further, according to the present embodiment, when the first Ti film 506A and the TiSi$_x$ film 507 are formed, Ar gas is not introduced into the processing chamber. If the Ar gas is introduced into the processing chamber, there is a possibility that Ar atoms collide with the Si surface 503 or the surface of the interlayer dielectric 504, and thus the morphology of the surface of each film may be deteriorated. However, according to the present embodiment, the morphology of the surface of each film layer can be maintained in a good state. Therefore, the film quality of the first Ti film 506A and the TiSi$_x$ film 507 formed on the above films is also improved. Further, since the interface between the TiSi$_x$ film 507 and the underlying Si surface 503 can be planarized, the height of the Schottky barrier can be made uniform over the entire region of the interface, thus realizing a stable Ohmic contact. For example, contact resistance can be reduced by applying this contact structure to a transistor.

Further, there is a possibility that Ar gas may cause damage to the first Ti film 506A and the TiSi$_x$ film 507. In this case, the film quality of the first Ti film 506A and the TiSi$_x$ film 507 are degraded, so that there is a possibility of increasing contact resistance while deteriorating a barrier function. Further, there is also a possibility that the film forming rate of the first Ti film 506A and the TiSi$_x$ film 507 may be decreased. However, according to the present embodiment, when the first Ti film 506A and the TiSi$_x$ film 507 are formed, Ar gas is not introduced into the processing chamber, and thus the first Ti film 506A and the TiSi$_x$ film 507 having high quality can be formed in a short period of time.

Figure 7C:
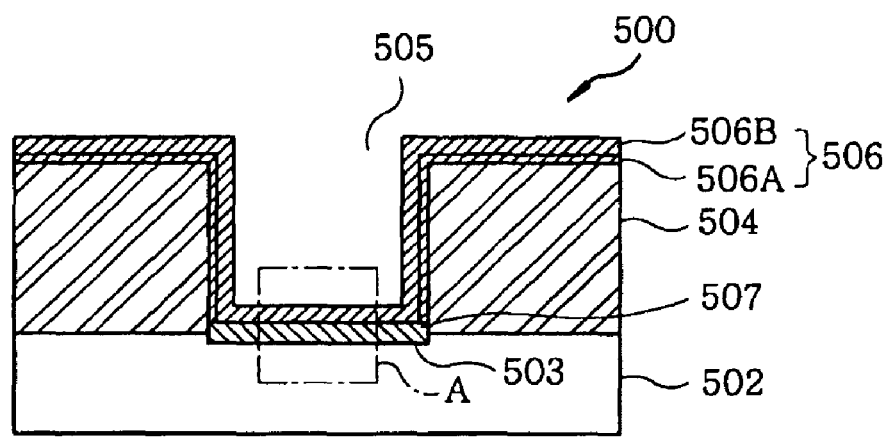
FIG. 7C is a diagram showing a second Ti film formation process according to an embodiment of the present invention.

Next, as shown in FIG. 7C, a Ti film formation step for forming a second Ti film 506B on the first Ti film 506A and the TiSi$_x$ film 507 is performed. Here, plasma Sequential Flow Deposition (SFD) is performed. In the Ti film formation step using the plasma SFD, a process for generating plasma and forming a Ti film while simultaneously supplying a Ti compound gas, Ar gas, and H$_2$ gas to the processing chamber, and a process for stopping the supply of the Ti compound gas and performing plasma annealing using H$_2$ plasma are performed two or more times. By way of this process, a Ti film having a predetermined thickness is formed in a short period of time. A detailed process recipe related to the formation of a Ti film based on plasma SFD according to the present embodiment will be described later.

However, a high-quality TiSi$_x$ film 507 can be formed by performing the above-described Ti film formation step based on plasma ALD. However, since the film forming rate thereof is excessively low, a lot of time is required in order to obtain a film thickness required for the Ti film 506 as a barrier layer, and thus this method is not practical. For that reason, in the present embodiment, the process for forming the first Ti film 506A is terminated at the time at which the film thickness of the TiSi$_x$ film 507 reaches a predetermined value, and a process for forming the second Ti film 506B is subsequently executed. By the plasma SFD used to form the second Ti film 506B, a high film forming rate is obtained at the time of Ti film formation, compared to the plasma ALD. Therefore, the Ti film 506 having a predetermined thickness can be formed in a short period of time.

Further, according to the present embodiment, the process temperature is set to a relatively low temperature (for example, a temperature range of 450° C. or less) when the second Ti film 506B is formed, similarly to the case where the first Ti film 506A and the TiSi$_x$ film 507 are formed. In the present embodiment, although the process temperature is adjusted to 450° C. or less by plasma annealing using H$_2$ plasma in plasma SFD, the density of impurities, such as Cl contained in the second Ti film 506B, can be remarkably reduced.

Figure 7D:
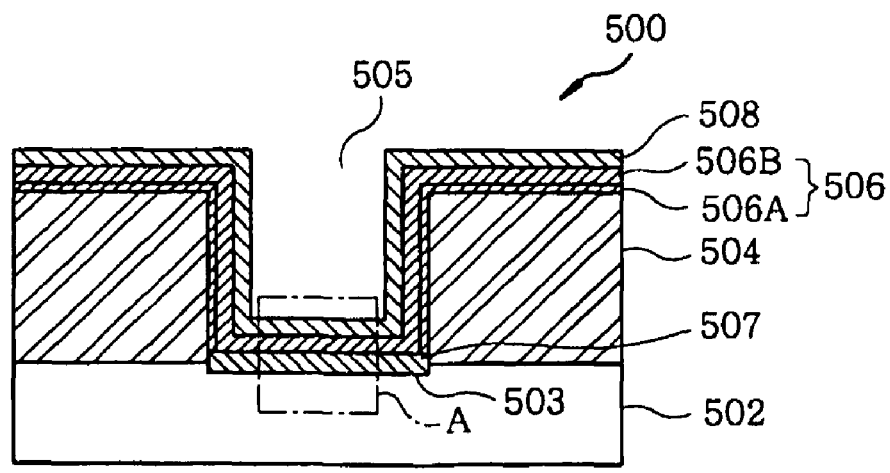
FIG. 7D is a diagram showing a TiN film formation process according to an embodiment of the present invention.

Next, as shown in FIG. 7D, a TiN film formation step for forming a TiN film 508 on the Ti film 506 is performed. Here, the TiN film formation step based on plasma SFD is performed rather than TiN formation based on typical thermal CVD. In the plasma SFD, for example, a process for generating plasma while supplying a Ti compound gas, Ar gas, and H₂ gas to the processing chamber to form a Ti film, a process for stopping the supply of the Ti compound gas, and a nitriding process for generating plasma while supplying NH₃ gas, Ar gas, and H₂ gas to the processing chamber to nitride the Ti film are performed two or more times. Thus, TiN is deposited on the base, and thus a TiN film is formed. A detailed process recipe related to the TiN film formation step based on plasma SFD according to the present embodiment will be described later.

As described above, a barrier layer composed of the TiSi$_x$ film 507, the Ti film 506, and the TiN film 508 is formed in the contact hole 505 of the Si wafer 500.

(First Ti Film Formation Step)

Of the above-described steps, a first Ti film formation step (titanium silicide film formation step), a second Ti film formation step (titanium film formation step), and a TiN film formation step, which are main processes of the present invention, are described in detail below. Here, the process of the present embodiment is described for the case where TiCl₄ gas is used as the Ti compound gas, H₂ gas is used as reducing gas, and NH₃ gas is used as nitrogen compound gas, by way of example.

Figure 8:
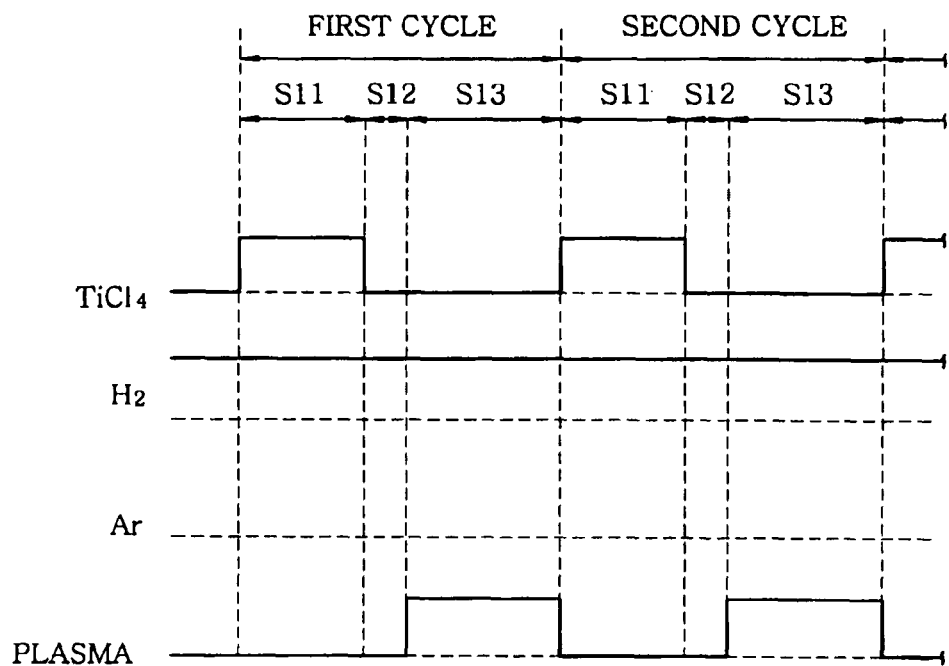
FIG. 8 is a timing diagram showing a detailed example of a Ti film formation process based on plasma ALD according to an embodiment of the present invention.

First, the first Ti film formation step is described below with reference to the drawings. As described above, plasma ALD is applied to the formation of the first Ti film 506A. A detailed example of the Ti film formation step based on plasma ALD is shown in FIG. 8.

First, when the first Ti film formation step is performed, electric power is fed from the heater power supply 440 to the heater 415 embedded in the susceptor 412, so that the temperature of a Si wafer W is adjusted to, for example, 450° C. Further, at step S11 (first step), TiCl₄ gas and H₂ gas are supplied into the processing chamber 411. At this time, the flow rate of the TiCl₄ gas is adjusted to, for example, 12 sccm, and the flow rate of the H₂ gas is adjusted to, for example, 4000 sccm. By performing the step S11, TiCl₄ is adsorbed onto the Si surface 503 and the surface of the interlayer dielectric 504. The time required to perform step s11 is set to, for example, 4 seconds.

Next, at step S12 (second step), the supply of the TiCl₄ gas is stopped, and only H₂ gas is supplied into the processing chamber 411, so that the TiCl₄ gas remaining in the processing chamber 411 is purged. At this time, the flow rate of the H₂ gas is adjusted to, for example, 4000 sccm. The time required to perform step S12 is set to, for example, 1.5 seconds.

Next, at step S13 (third step), a high-frequency power of, for example, 800 W is applied to the shower head (upper electrode) 420 disposed in the processing chamber 411 at the same time that H₂ gas is supplied into the processing chamber 411 at a flow rate of, for example, 4000 sccm, and thus the H₂ gas is converted into plasma in the processing chamber 411. Through this operation, TiCl₄ adsorbed onto the Si surface 503 and the surface of the interlayer dielectric 504 at the above step S11, is reduced, and, as a result, Ti remains.

The above steps S11 to S13 are performed as one cycle, and the cycle is repeated until the film thickness of the first Ti film 506A reaches a desired thickness (for example, 2 nm). At this time, as described above, deposited Ti is silicided by Si of the underlying Si surface 503 at the bottom of the contact hole (portion A in FIG. 7A). As a result, the TiSi$_x$ film 507 is formed in a self-aligning manner (refer to FIG. 7B).

(Second Ti Film Formation Step)

Figure 9:
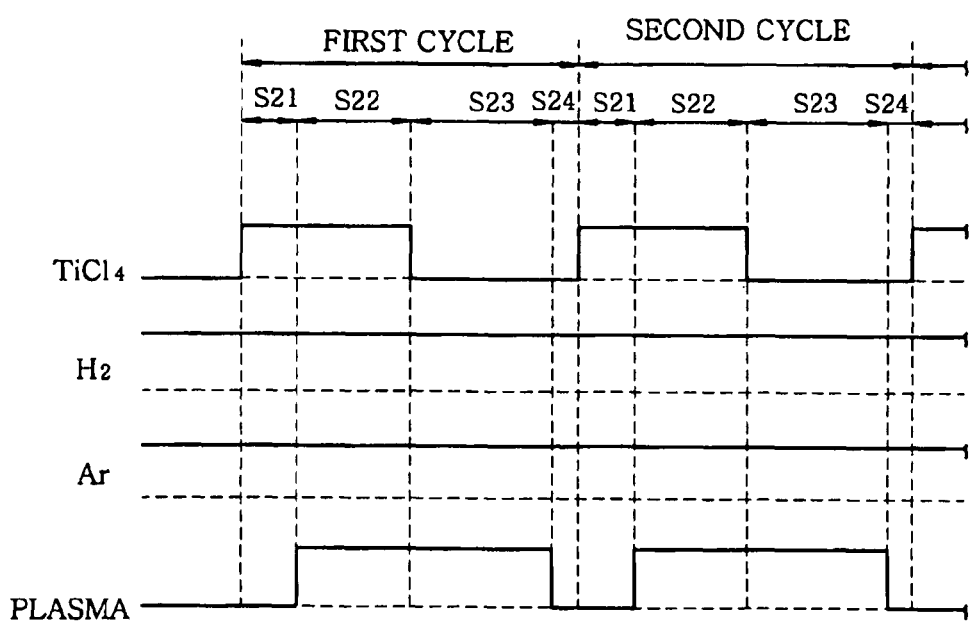
FIG. 9 is a timing diagram showing a detailed example of a Ti film formation process based on plasma SFD according to an embodiment of the present invention.

Next, a second Ti film formation step is described with reference to the drawings. The second Ti film 506B is formed on the first Ti film 506A and the TiSi$_x$ film 507. As described above, plasma SFD is applied to the formation of the second Ti film 506B. A detailed example of this plasma SFD is shown in FIG. 9.

First, when the first Ti film formation step is performed, electric power is fed from the heater power supply 440 to the header 415 embedded in the susceptor 412, and thus the temperature of a Si wafer W is adjusted to, for example, 450° C. Further, at step S21 (gas stabilization step), TiCl₄ gas, H₂ gas and Ar gas are supplied into the processing chamber 411. At this time, the flow rate of the TiCl₄ gas is adjusted to, for example, 12 sccm, the flow rate of the H₂ gas is adjusted to, for example, 4000 sccm, and the flow rate of the Ar gas is adjusted to, for example, 1600 sccm. The main purpose of this step S21 is to stabilize the process gas within the processing chamber prior to the subsequent step S22. The time required to perform step S21 is set to, for example, from 0 to 2 seconds.

Next, at step S22 (fourth step), a high-frequency power of, for example, 800 W, is applied to the shower head (upper electrode) 420 disposed in the processing chamber 411 while the TiCl₄ gas, the H₂ gas and the Ar gas supplied at step S21 are constantly supplied into the processing chamber 411 at the same flow rate, and thus plasma is formed in the processing chamber 411. Because of this, the second Ti film is formed on the first Ti film 506A and the TiSi$_x$ film 507. The time required to perform step S22 is set to, for example, 4 seconds.

Next, the supply of TiCl₄ gas performed at step S22 is stopped, and step S23 (fifth step) is started. That is, at step S23, H₂ gas and Ar gas are supplied into the processing chamber 411 at the same flow rate as that of step S22, and are converted into plasma in the processing chamber 411. By way of this, the second Ti film, formed on the first titanium film 506A and the TiSi$_x$ film 507 at the above step S22, is plasma-annealed. The time required to perform step S23 is set to, for example, 5 seconds.

Next, plasma is extinguished from the state of step S23, and step S24 is started. The step S24 corresponds to a waiting time until a subsequent cycle starts, and is set to, for example, 1 second.

The above steps S21 to S24 are implemented as one cycle, and this cycle is repeated until the film thickness of the second Ti film 506B reaches a desired thickness. Meanwhile, at steps S21 to S24, it is also possible that Ar gas may not be introduced into the processing chamber.

Through this construction, the first Ti film formation and the second Ti film formation are performed, so that a Ti film 506 in which the first Ti film 506A and the second Ti film 506B are stacked on top of each other is formed. Further, the TiSi$_x$ film 507 is formed on the boundary region between the Ti film 506 and the Si surface 503 (refer to FIG. 7C).

(Tin Film Formation Step)

Figure 10:
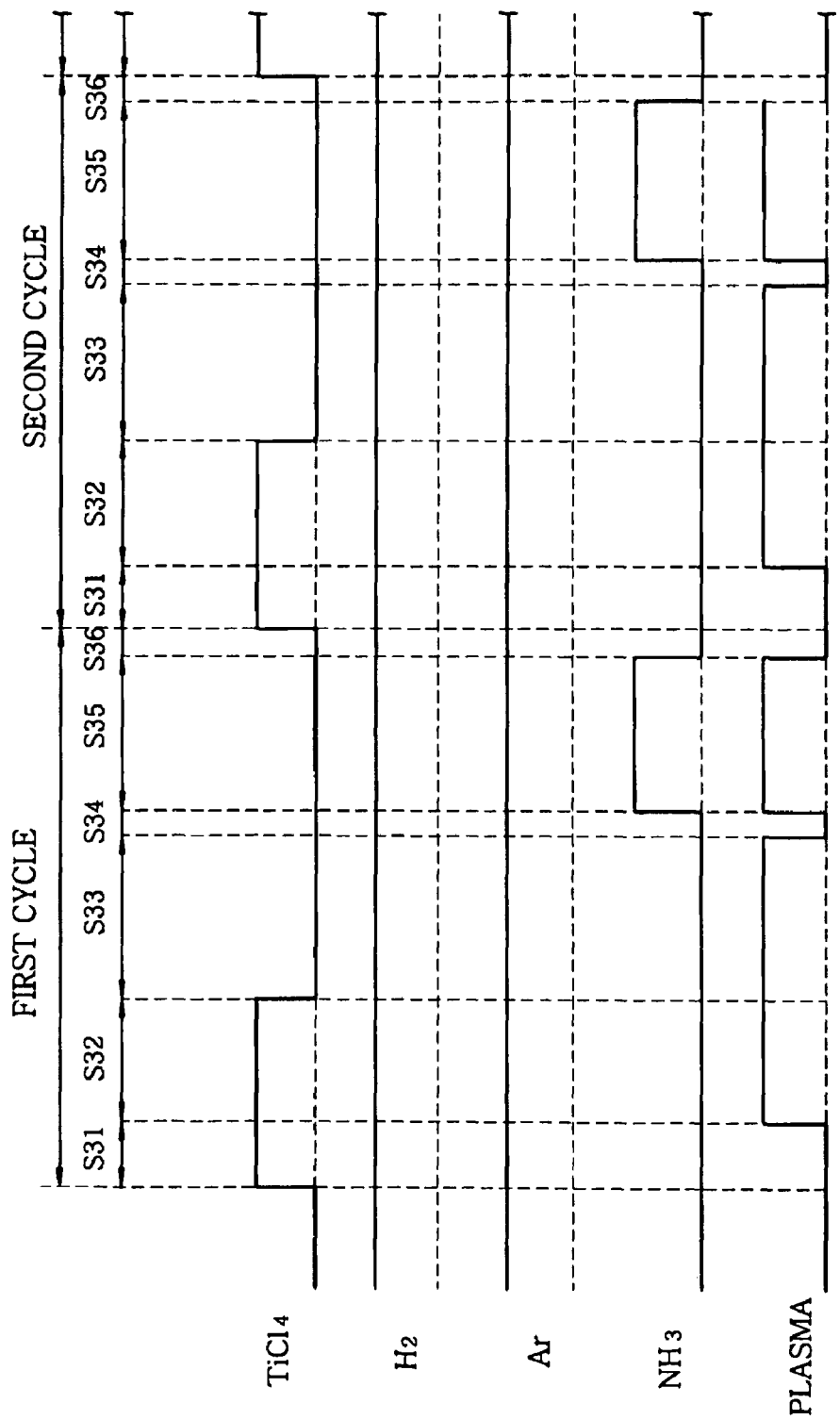
FIG. 10 is a timing diagram showing a detailed example of a TiN film formation process based on plasma SFD according to an embodiment of the present invention.

Next, a TiN film formation step is described below with reference to the drawings. The TiN film 508 is formed on the Ti film 506. As described above, the TiN film formation step based on plasma SFD is applied to the formation of the TiN film 508. A detailed example of this plasma SFD is shown in FIG. 10.

Among steps S31 to S36 in the TiN film formation step, steps S31 to S33 (gas stabilization step, the sixth step and the seventh step) and step S34 are used to perform the process similar to steps S21 to S24 of the above-described second Ti film formation, and thus a detailed description thereof is omitted here. After steps S31 to S34 are performed, a Ti film is formed on the Ti film 506. Thereafter, step S35 (the eighth step) is performed, so that the Ti film is nitrided, and a TiN film is formed. When performing the TiN film formation step, electric power is fed from the heater power supply 440 to the heater 415 embedded in the susceptor 412, and thus the temperature of the Si wafer W is adjusted to, for example, 450° C.

At step S35, a high-frequency power of 800 W is applied to the shower head (upper electrode) 420 disposed in the processing chamber 411 while $H_2$ gas, Ar gas and $NH_3$ gas are supplied into the processing chamber 411, and thus plasma is formed again in the processing chamber 411. At this time, the flow rate of the $H_2$ gas is adjusted to, for example, 2000 sccm, the flow rate of the Ar gas is adjusted to, for example, 1600 sccm, and the flow rate of the $NH_3$ gas is adjusted to, for example, 1500 sccm. The time required to perform step S35 is set to, for example, 2 seconds.

At step S36, the supply of the $NH_3$ gas into the processing chamber 411 is stopped at the same time that the plasma is extinguished. The flow rates of the $H_2$ gas and the Ar gas are adjusted to the same flow rates as those of step S35. By these gases, the $NH_3$ gas remaining in the processing chamber 411 is purged. Because of this, when it proceeds to the step S31 of a subsequent cycle, the $TiCl_4$ gas supplied into the processing chamber 411 is prevented from being mixed with the remaining $NH_3$ gas, and thus the TiN film having high quality can be formed. The time required to perform step S36 is set to, for example, 2 seconds. The above steps S31 to S36 are implemented as one cycle, and this cycle is repeated until the film thickness of the TiN film 508 reaches a desired thickness.

Characteristics of Film Formation Step in the Present Embodiment

The first characteristic of the film formation step according to the present embodiment is that the formation of the Ti film 506 is performed by dividing a formation step into two steps, that is, a first Ti film formation step and a second Ti film formation step. Further, in the present embodiment, different steps, that is, plasma ALD and plasma SFD, are applied to the formation of the first Ti film 506A and the formation of the second Ti film 506B, respectively.

First, the temperature of the Si wafer W is adjusted to a low temperature, for example, 450° C. or less by initially performing plasma ALD, so that impurities, such as Cl contained in the Ti film, can be suppressed, and a high-quality $TiSi_x$ film 507 can be formed. Thereafter, the process is switched from plasma ALD to plasma SFD that enables a relatively high film forming rate to be obtained, so that the Ti film 506 having a predetermined film thickness can be formed in a short period of time. Further, even at that time, the temperature of the Si wafer W is adjusted to a low temperature, for example, 450° C. or less, and thus the thermal budget can be saved.

Another characteristic of the film formation step according to the present embodiment is that Ar gas is not introduced into the processing chamber 411 during the process of first Ti film formation. Because of this, the first Ti film 506A and the $TiSi_x$ film 507 having high quality can be formed without decreasing the film forming rate.

Figure 11:
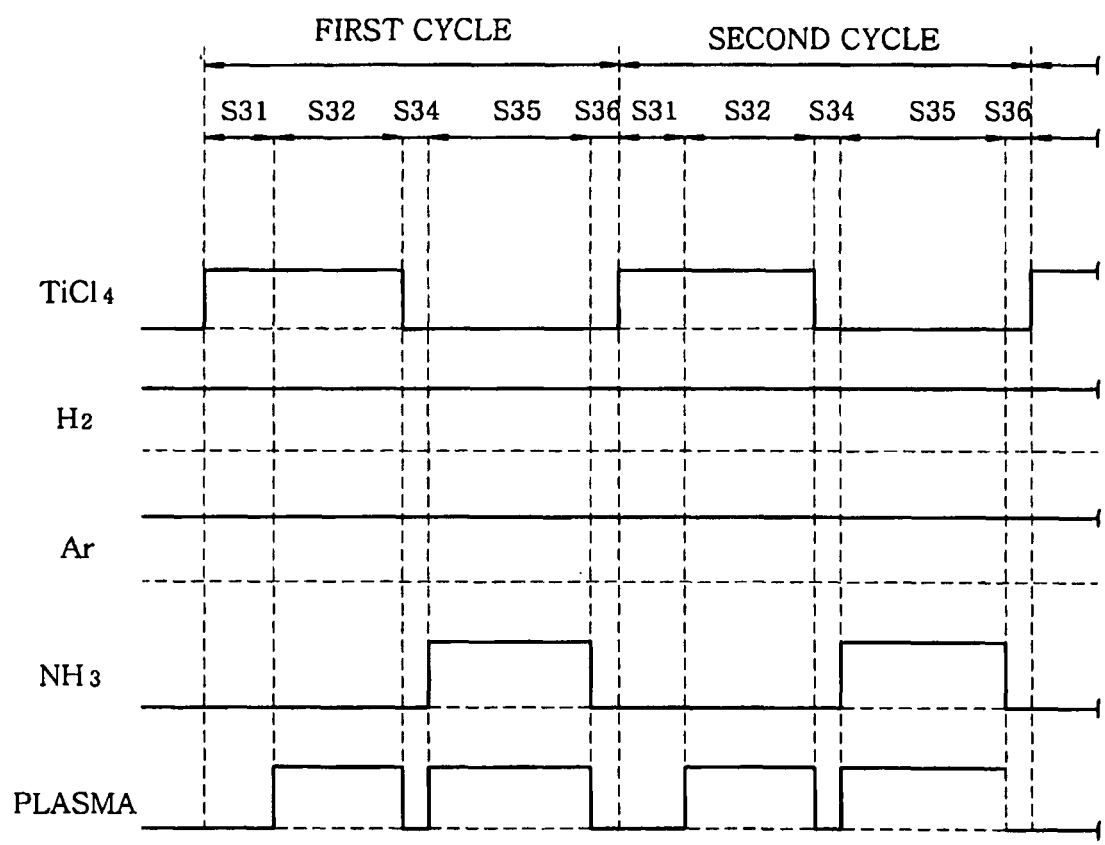
FIG. 11 is a timing diagram showing another detailed example of a TiN film formation process based on plasma SFD according to an embodiment of the present invention.

However, step S33 in the plasma SFD in FIG. 10 is a process for performing $H_2$ plasma annealing on the Ti film. This process is performed simultaneously with the nitridation of plasma, which is the case also at the step S35. Therefore, instead of plasma SFD shown in FIG. 10, plasma SFD of FIG. 11 in which step S33 is omitted may also be performed. In the plasma SFD of FIG. 11, step S34 is a process for purging $TiCl_4$ gas remaining in the processing chamber 411 using $H_2$ and Ar gases, rather than assigning a waiting time required until the subsequent step S35 starts. In this case, the time required to perform step S34 is set to, for example, 2 seconds.

(Experiments on Verification of Effects of Plasma ALD)

The results of experiments on the verification of the effects obtained from the film formation step according to the present embodiment having the above characteristics are described below with reference to the drawings. When a Ti film is formed at low temperature, it can be verified through experiments that the Ti film can be silicided by employing plasma ALD. The results of these experiments are shown in FIGS. 12 and 13.

FIG. 12 is a diagram showing the results of measurement of the film thickness of Ti films when the plasma ALD and the plasma SFD were separately performed on a sample wafer having the film structure of FIG. 6. As shown in FIG. 12, when the plasma SFD was performed, the thickness of the Ti film formed on a $SiO_2$ film (interlayer dielectric 504) was 9.5 nm, the thickness of the Ti film formed on the Si film (Si surface 503) was 8.7 nm, and the ratio thereof was 0.92. That is, when plasma SFD is performed, Ti films having almost the same thickness were formed on the $SiO_2$ film and the Si film. On the basis of the results, it is thought that the film qualities of the Ti films formed on the $SiO_2$ film and the Si film are identical to each other.

Meanwhile, as shown in FIG. 12, when plasma ALD was performed, the thickness of a Ti film formed on the $SiO_2$ film (interlayer dielectric 504) was 7.4 nm, the thickness of a Ti film formed on the Si film (Si surface 503) was 23.1 nm, and the ratio thereof was 3.12. That is, when plasma ALD was performed, a Ti film with a thickness at least three times greater than that of the Ti film formed on the $SiO_2$ film was formed on the Si film. From these results, it is thought that a Ti film having film quality, differing from that of the Ti film formed on the $SiO_2$ film, is formed on the Si film. Further, since the base is a Si film, it can be observed that the Ti film was silicided, and thus the volume (film thickness) thereof was increased.

In order to directly verify whether a Ti film formed on a Si film is silicided by performing plasma ALD on a sample wafer having the film structure of FIG. 6, the components of the Ti film (Ti-containing film) on the Si film were analyzed using Energy Dispersive X-ray (EDX) (fluorescent X ray). The results of analysis are shown in FIG. 13.

As shown in FIG. 13, the percentage of Si in the Ti-containing film on the Si film was 81.38 atom % (ratio of the numbers of atoms), the percentage of Ti is 13.19 atom %, the percentage of Cl is 0.18 atom %, and the percentage of O is 5.25 atom %. From these results, it can be seen that the Ti film, formed on the Si film by performing plasma ALD, was silicided and was then converted into a $TiSi_x$ film.

Further, from the results of the experiments of FIG. 13, it can be seen that Cl is scarcely contained in the $TiSi_x$ film obtained by performing plasma ALD. Therefore, it can be determined that the reduction of $TiCl_4$, adsorbed onto the Si film during the processing of plasma ALD, can be precisely conducted.

(Experiments on Verification of Effects of Ti Film Formation Step Performed without Using Ar Gas)

Next, effects obtained by performing the first Ti film formation step without using Ar gas were verified through experiments. The results of these experiments are shown in FIGS. 14A, 14B, 15, and 16.

Figure 14A:
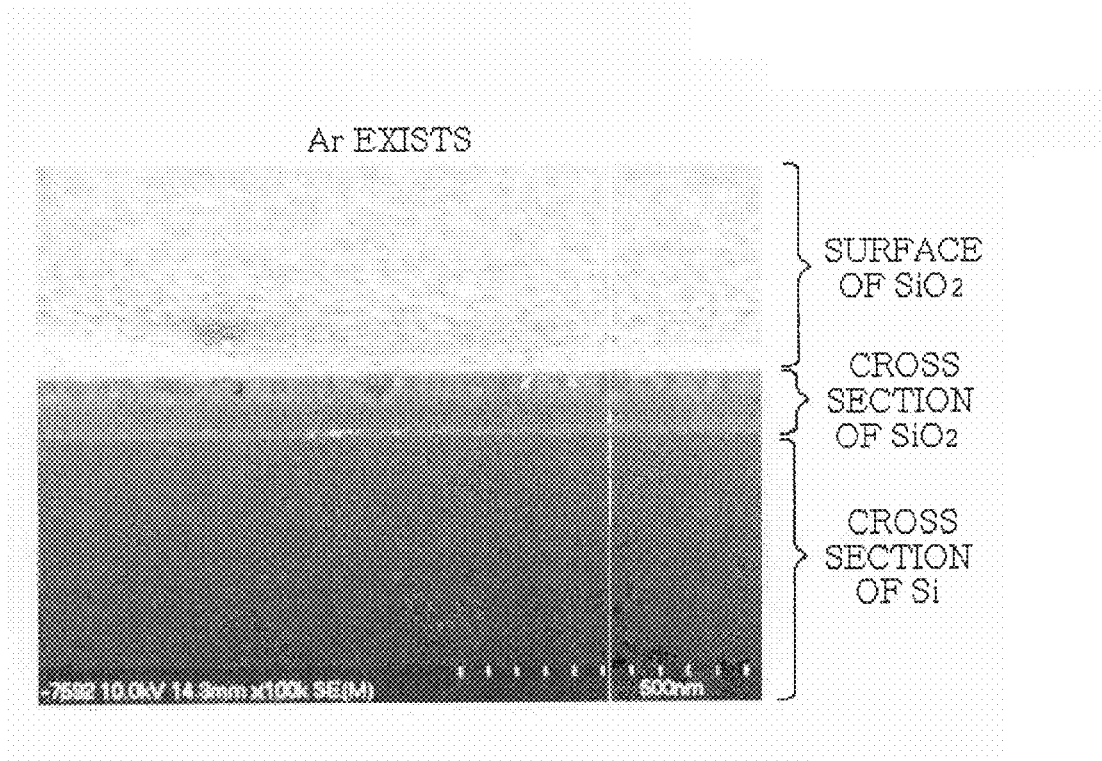
FIG. 14A is a diagram showing a Scanning Electron Microscope (SEM) picture of the section and the surface of a sample wafer on which plasma reduction is performed using Ar gas and H$_2$ gas.

First, the results of processing, obtained when plasma reduction was performed on a sample wafer having the film structure of FIG. 6 by introducing Ar gas and $H_2$ gas into a processing chamber, are compared with those when plasma reduction was performed on the sample wafer by introducing only $H_2$ gas into the processing chamber. FIG. 14A illustrates a Scanning Electron Microscope (SEM) picture of the section and the surface of a portion, in which the Si film and the SiO$_2$ film are stacked on top of each other, in a sample wafer on which plasma reduction was performed using Ar gas and H$_2$ gas. Further, FIG. 14B illustrates an SEM picture of the section and surface of a portion, in which the Si film and the SiO$_2$ film are stacked on top of each other, in a sample wafer on which plasma reduction was performed using only H$_2$ gas.

Figure 14B:
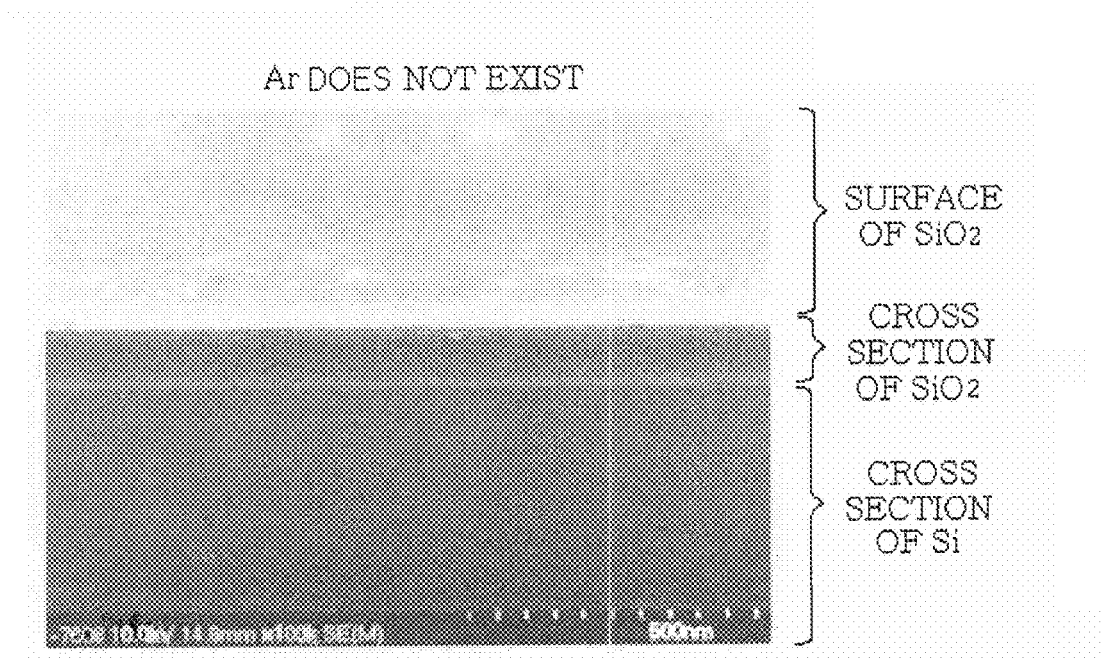
FIG. 14B is a diagram showing an SEM picture of the section and the surface of a sample wafer on which plasma reduction is performed using only H$_2$ gas.

From the pictures of FIGS. 14A and 14B, it can be seen that the morphology of the surface of the SiO$_2$ film of the sample wafer on which plasma reduction was performed using only the H$_2$ gas is maintained in a good state. On the basis of the results of the experiments, it may be considered that there is a fear that Ar gas may cause a lot of damage to the surface of a film.

FIG. 15 is a diagram showing the electrical characteristics of the Ti film formed on the SiO$_2$ film when plasma ALD was performed on a sample wafer having the film structure of FIG. 6 during a period corresponding to 300 cycles. Curves in the plan view of the wafer in FIG. 15 were obtained by connecting respective points having the same resistances in the surface of the wafer to each other. The intervals between respective curves are dense in an area of the wafer surface in which the difference between the resistances of the Ti film is large.

As shown in FIG. 15, in the case where Ar gas was supplied to the processing chamber during the processing of plasma ALD, curves are dense in the entire region of the wafer surface compared to the case where Ar gas was not supplied during the processing of plasma ALD. Accordingly, it can be seen that the difference between the resistances of the Ti film within the wafer surface is large. This is apparent from the uniformity values of the Ti film in the wafer surface indicated in a lower portion of the drawing. That is, when Ar gas does not exist, the uniformity value is 2.1%; when Ar gas exists, the uniformity value is 90.4, which exhibits an excessively large resistance difference.

Further, as shown in FIG. 15, when Ar gas does not exist, the surface resistance of the wafer is 270 Ω/sq, and resistivity is 209 μΩ·cm; when Ar gas exists, the surface resistance of the wafer is 1306 Ω/sq, and resistivity is 1208 μΩ·cm. It can be seen that when Ar gas is supplied into the processing chamber, the resistances of the Ti film are increased.

As described above, it can be seen that, from the standpoint of the in-surface uniformity of resistances, surface resistances and resistivity of the Ti film, when Ar gas exists, the characteristics are deteriorated compared to the case where Ar gas does not exist. On the basis of the results of the experiments, it may be considered that when Ar gas exists, Ar causes damage to the Ti film itself, the underlying Si or SiO$_2$ film, thus preventing a high-quality Ti film from being formed. For example, there is a probability that Ar collides with the SiO$_2$ film, so that O is discharged, and combines with Ti, and thus part of the Ti film may become a TiO$_x$ film (titanium oxide film). Since the TiO$_x$ film has a higher resistance than the Ti film made of metal, the electrical characteristics of FIG. 15 are measured.

Figure 16:
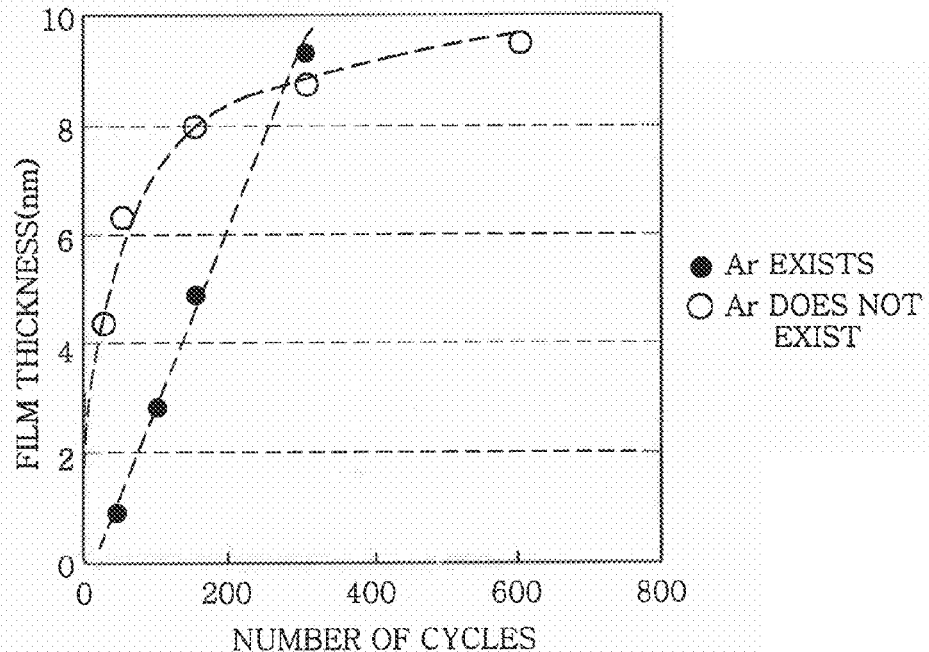
FIG. 16 is a diagram showing the relationship between the film thickness of a Ti film formed on an SiO$_2$ film and the number of cycles of a film formation step when a Ti film formation step based on plasma ALD is performed on a sample wafer.
Figure 17:
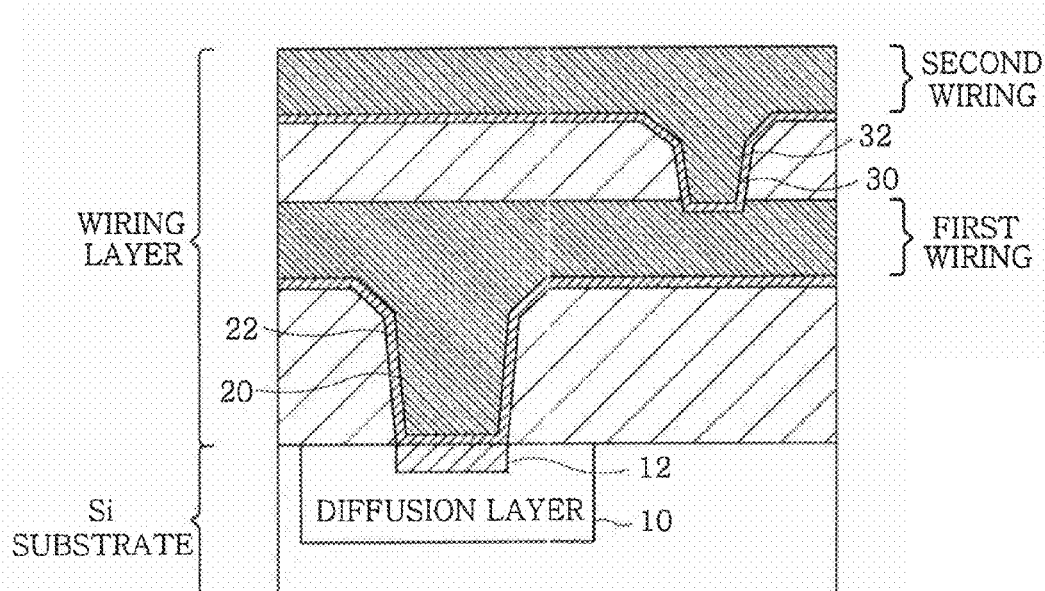
FIG. 17 is a diagram showing the wiring structure of a semiconductor device.

FIG. 16 illustrates the relationship between the film thickness of a Ti film formed on a SiO$_2$ film and the number of cycles required for the film formation step when the Ti film formation step based on plasma ALD is performed on a sample wafer, the temperature of which is adjusted to 450° C. In the graph of FIG. 16, the results of processing performed when Ar gas is not introduced into the processing chamber are indicated by 'O', and the results of processing performed when Ar gas is introduced into the processing chamber are indicated by '●'.

As apparently shown in FIG. 16, when the number of cycles is equal to or less than 300, a Ti film using no Ar gas can be formed thicker than a Ti film using Ar gas even for the same number of cycles. In other words, the first Ti film 506A can be formed to have a desired film thickness in a short period of time. Compared to this, when the number of cycles exceeds about 300, the film forming rate of the Ti film formed using Ar gas is increased. However, since, actually, the first Ti film 506A is formed to have an excessively small thickness (for example, 2 nm), it is sufficient to pay attention to only an area in which the number of cycles is equal to or less than about 300.

In this way, it is considered that, from the results of FIG. 16 indicting that the difference between the film forming rates of the Ti film occurs due to the existence/non-existence of Ar gas, Ar may be the cause of the deterioration of the film forming rate of the Ti film at the initial step of the Ti film formation in special. Therefore, in order to at least prevent the film forming rate from being deteriorated, it is preferable not to introduce Ar gas into the processing chamber during the processing of plasma ALD.

As described above, according to the film formation step of the present embodiment, the Ti film 506 and the TiN film 508, each including few impurities such as Cl, can be formed even at low temperature. Further, when the Ti film 506 is formed, since both plasma ALD, enabling the formation of the TiSi$_x$ film at low temperature, and plasma SFD, having a high film forming rate, are used together, the time required for the formation of the Ti film 506 can be reduced while a high-quality TiSi$_x$ film 507 can be obtained. Further, in the plasma ALD, since Ar gas is not introduced into the processing chamber, the film quality of the Ti film 506 or the TiSi$_x$ film 507 is further improved.

Further, the construction of each of the processing chambers 104A to 104D is not limited to that of FIG. 4. For example, it is possible to implement any of the processing chambers 104A to 104D as a COR processing chamber, a PHT processing chamber, and a Ti film•TiN film formation processing chamber. Therefore, in the case of the sequence of transfer of the Si wafer W, when the Si wafer W is transferred to chambers in the sequence of the COR processing chamber, the PHT processing chamber, and the Ti film and TiN film formation processing chamber among the processing chambers 104A to 104D, there is no need to necessarily transfer the wafer W in the sequence of respective processing chambers 104A to 104C.

Further, in the present embodiment, the construction and operation have been described on the basis of the case where the processing chamber 104C successively performs the Ti film formation step and the TiN film formation step, but it is also possible to perform the respective steps in separate processing chambers. For example, the processing chamber 104C may perform the Ti film formation step, and the processing chamber 104D may perform the TiN film formation step.

The present invention described in detail according to the embodiments may be applied to a system composed of a plurality of devices, or to an apparatus implemented using a single device. Further, it is apparent that the present invention can also be achieved in such a way that media, such as a storage medium in which a software program for implementing the functions of the above embodiments is stored, are provided to the system or the apparatus, and that the computer (or Central Processing Unit [CPU] or Microprocessor Unit [MPU]) of the system or the apparatus reads the program stored in the media, such as the storage medium, and executes the program.

In this case, the program itself, read from the media, such as the storage medium, implements the functions of the above-described embodiments, and the media, such as the storage medium for storing the program, constitute the present invention. As examples of the media such as a storage medium for providing the program, a floppy (registered trademark) disc, a hard disc, an optical disc, a magneto-optical disc, Compact Disc-Read Only Memory (CD-ROM), CD-Recordable (R), CD-Rewritable (RW), Digital Versatile Disc (DVD)-ROM, DVD-Random Access Memory (RAM), DVD-Rewritable (RW), DVD+RW, magnetic tape, a non-volatile memory card, ROM or downloading over a network may be used.

Further, as well as the construction in which the functions of the embodiments are implemented by executing the program read by the computer, the construction in which an Operating System (OS) or the like, driven in the computer, executes part or all of actual processing in compliance with the instructions of the program and the functions of the embodiments are implemented by the processing may be included in the scope of the present invention.

Further, the construction in which, after a program, read from the media such as a storage medium, is written in memory, which is provided in a function extension board inserted into the computer or a function extension unit connected to the computer, a CPU, provided in the function extension board or the function extension unit, executes part or all of actual processing in compliance with the instructions of the program, and the functions of the embodiments are implemented by the processing, may also be included in the scope of the present invention.

Although the preferred embodiments of the present invention have been disclosed for illustrative purposes, it is apparent that the present invention is not limited by the above embodiments. Those skilled in the art will appreciate that various modifications or changes are possible, without departing from the scope and spirit of the invention as disclosed in the accompanying claims. It should be understood that the above modifications or changes are included in the technical scope of the present invention.

For example, in the above embodiment, the case where a $TiSi_x$ film is formed on the Si surface of the Si wafer as a Si-containing surface has been described in the above embodiment, but the present invention is not limited to this example, and it is possible to form a $TiSi_x$ film on a metal silicide film, such as $CoSi_2$ or NiSi formed on the Si wafer, or on a polysilicon (poly-Si) film, as the Si-containing surface.

Further, in the embodiments, the case where $TiCl_4$ gas is used as a titanium compound gas has been described by way of example, but the present invention is not limited to this example, and other titanium compound gases may be employed. For example, it is also possible to use TDEAT (dimethylamino titanium) or TDEAT (diethylamino titanium) as organic titanium.

INDUSTRIAL APPLICABILITY

The present invention can be applied to a film forming method and substrate processing apparatus for forming a predetermined film on a target substrate, such as a semiconductor wafer or a FPD substrate.

What is claimed is:
1. A film forming method of forming a titanium film or a titanium compound film on a target substrate in a processing chamber, comprising:
a titanium silicide film formation step of forming a titanium silicide film on the target substrate; and
a titanium film formation step of forming a titanium film on the titanium silicide film, wherein the titanium silicide film formation step is performed by repeating:
a first step of introducing titanium compound gas into the processing chamber and adsorbing the titanium compound gas onto a surface of the target substrate,
a second step of stopping the introduction of the titanium compound gas into the processing chamber to thereby remove the titanium compound gas remaining in the processing chamber, and
a third step of generating plasma in the processing chamber while introducing hydrogen gas into the processing chamber to thereby reduce the titanium compound gas adsorbed onto a silicon-containing surface of the target substrate, and of reacting the titanium compound gas with silicon of the silicon-containing surface to thereby form the titanium silicide film, and the first to the third steps are sequentially performed in that order twice or more,
wherein the titanium film formation step is performed by repeating:
a fourth step of generating plasma in the processing chamber while introducing the titanium compound gas and the hydrogen gas into the processing chamber to thereby form the titanium film on the target substrate, and
a fifth step of stopping introduction of the titanium compound gas into the processing chamber while maintaining the plasma to thereby perform plasma annealing on the titanium film.

2. The film forming method of claim 1, wherein, in the third step, argon gas is not introduced into the processing chamber.

3. The film forming method of claim 1, wherein, in the titanium silicide film formation step and the titanium film formation step, a temperature of the target substrate is adjusted to 450° C. or less.

4. The film forming method of claim 1, wherein, in the first step, the hydrogen gas together with the titanium compound gas are introduced into the processing chamber, and
wherein, in the second step, the hydrogen gas is continuously introduced into the processing chamber.

5. The film forming method of claim 1, wherein, in the titanium film formation step, argon gas is introduced into the processing chamber during at least a period in which plasma is formed in the processing chamber.

6. The film forming method of claim 1, further comprising a titanium nitride film formation step of forming a titanium nitride film on the titanium film,
wherein the titanium nitride film formation step is performed by repeating:
a sixth step of generating plasma in the processing chamber while introducing the titanium compound gas and the hydrogen gas into the processing chamber to thereby form a titanium film on the target substrate,
a seventh step of stopping introduction of the titanium compound gas into the processing chamber to thereby remove the titanium compound gas remaining in the processing chamber, and
an eighth step of generating plasma in the processing chamber while introducing a nitrogen compound gas into the processing chamber to thereby nitride the titanium film.

7. The film forming method of claim 6, wherein, in the titanium nitride film formation step, a temperature of the target substrate is adjusted to 450° C. or less.

8. The film forming method of claim 6, wherein, in the titanium nitride film formation step, argon gas is introduced into the processing chamber during at least a period in which plasma is formed in the processing chamber.

9. The film forming method of claim 6, wherein the nitrogen compound gas is $NH_3$ gas.

10. The film forming method of claim 6, wherein the sixth to the eighth step are sequentially performed in that order twice or more.

11. The film forming method of claim 1, wherein the titanium compound gas is $TiCl_4$ gas.

12. The film forming method of claim 1, wherein the fourth and the fifth step are sequentially performed in that order twice or more.

13. A substrate processing apparatus, comprising:
a processing chamber in which a film formation is formed on a target substrate;
a gas supply unit configured to selectively supply at least titanium compound gas, reducing gas and argon gas into the processing chamber;
a plasma generation unit configured to generate plasma in the processing chamber;
a temperature adjustment unit configured to adjust a temperature of the target substrate mounted in the processing chamber; and
a control unit configured to control operations of the gas supply unit, the plasma generation unit, and the temperature adjustment unit,
wherein the control unit performs a titanium silicide film formation step of forming a titanium silicide film on the target substrate by repeating:
a first step of introducing titanium compound gas into the processing chamber and adsorbing the titanium compound gas onto a surface of the target substrate,
a second step of stopping introduction of the titanium compound gas into the processing chamber to thereby remove the titanium compound gas remaining in the processing chamber, and
a third step of generating plasma in the processing chamber while introducing hydrogen gas into the processing chamber to thereby reduce the titanium compound gas adsorbed onto a silicon-containing surface of the target substrate, and of reacting the titanium compound gas with silicon of the silicon-containing surface to thereby form the titanium silicide film, and the first to the third steps are sequentially performed in that order twice or more,
wherein the control unit performs a titanium film formation step of forming a titanium film on the titanium silicide film by repeating:
a fourth step of generating plasma in the processing chamber while introducing the titanium compound gas and the hydrogen gas into the processing chamber to thereby form the titanium film on the target substrate, and
a fifth step of stopping introduction of the titanium compound gas into the processing chamber while maintaining the plasma, thus performing plasma annealing on the titanium film.

14. The substrate processing apparatus of claim 13, wherein the gas supply unit is configured to selectively supply nitrogen compound gas into the processing chamber, and
the control unit performs a titanium nitride film formation step of forming a titanium nitride film on the titanium film by repeating:
a sixth step of generating plasma in the processing chamber while introducing the titanium compound gas and the hydrogen gas into the processing chamber to thereby form a titanium film on the target substrate,
a seventh step of stopping introduction of the titanium compound gas into the processing chamber to thereby remove the titanium compound gas remaining in the processing chamber, and
an eighth step of generating plasma in the processing chamber while introducing a nitrogen compound gas into the processing chamber to thereby nitride the titanium film.

15. The substrate processing apparatus of claim 14, wherein the sixth to the eighth step are sequentially performed in that order twice or more.

16. The substrate processing apparatus of claim 13, wherein the fourth and the fifth step are sequentially performed in that order twice or more.

* * * * *